US009620921B2

(12) United States Patent
Sugiyama et al.

(10) Patent No.: US 9,620,921 B2
(45) Date of Patent: Apr. 11, 2017

(54) QUANTUM CASCADE LASER MANUFACTURING METHOD

(75) Inventors: Atsushi Sugiyama, Hamamatsu (JP); Naota Akikusa, Hamamatsu (JP); Tadataka Edamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 11 days.

(21) Appl. No.: 14/342,895

(22) PCT Filed: Jul. 4, 2012

(86) PCT No.: PCT/JP2012/067116
§ 371 (c)(1),
(2), (4) Date: Mar. 5, 2014

(87) PCT Pub. No.: WO2013/061656
PCT Pub. Date: May 2, 2013

(65) Prior Publication Data
US 2014/0199798 A1    Jul. 17, 2014

(30) Foreign Application Priority Data

Oct. 28, 2011   (JP) .................................. 2011-237704

(51) Int. Cl.
H01S 5/34      (2006.01)
H01S 3/08      (2006.01)
(Continued)

(52) U.S. Cl.
CPC .......... *H01S 3/08009* (2013.01); *B82Y 10/00* (2013.01); *B82Y 20/00* (2013.01);
(Continued)

(58) Field of Classification Search
CPC ........ H01S 3/08009; H01S 5/124; H01S 5/34; H01S 5/3401; H01S 5/3402
(Continued)

(56) References Cited

U.S. PATENT DOCUMENTS 5,457,709 A   10/1995 Capasso et al.
5,745,516 A    4/1998 Capasso et al.
(Continued)

FOREIGN PATENT DOCUMENTS

JP       8-279647 A    10/1996
JP    H09-312437 A    12/1997
(Continued)

OTHER PUBLICATIONS

M. Usami, S. Akiba and K. Utaka, "Asymmetric lambda/4-shifted InGaAsP/InP DFB laser", Jun. 1987, IEEE, IEEE Journal of Quantum Electronics, vol. QE-23, No. 6, pp. 815-821.*
(Continued)

*Primary Examiner* — William F Kraig
*Assistant Examiner* — Pavel Ivanov
(74) *Attorney, Agent, or Firm* — Drinker Biddle & Reath LLP

(57) ABSTRACT

A quantum cascade laser manufacturing method includes: a step of pressing a mother stamper against a resin film having flexibility to make a resin stamper 201 having a second groove pattern P2; a step of making a wafer with an active layer formed on a semiconductor substrate; a step of forming a resist film 304 on a surface on the active layer side of the wafer; a step of pressing the resin stamper against the resist film 304 by air pressure to form a third groove pattern P3 on the resist film 304; and a step of etching the wafer with the resist film 304 serving as a mask to form a diffraction grating on a surface of the wafer.

4 Claims, 18 Drawing Sheets

(51) Int. Cl.
    *B82Y 10/00* (2011.01)
    *B82Y 20/00* (2011.01)
    *B82Y 40/00* (2011.01)
    *H01S 5/12* (2006.01)
    *B29C 33/42* (2006.01)
    *G03F 7/00* (2006.01)

(52) U.S. Cl.
    CPC ............. *B82Y 40/00* (2013.01); *H01S 5/124* (2013.01); *H01S 5/3401* (2013.01); *B29C 33/424* (2013.01); *B29C 2033/426* (2013.01); *G03F 7/0002* (2013.01); *H01S 5/3402* (2013.01)

(58) Field of Classification Search
    USPC .......................................................... 438/32
    See application file for complete search history.

(56) References Cited

U.S. PATENT DOCUMENTS

| | | | | |
|---|---|---|---|---|
| 6,153,499 | A * | 11/2000 | Anda et al. | 438/579 |
| 6,560,259 | B1 * | 5/2003 | Hwang | 372/45.01 |
| 6,638,773 | B1 * | 10/2003 | Hwang et al. | 438/2 |
| 6,751,244 | B2 | 6/2004 | Faist et al. | |
| 6,922,427 | B2 | 7/2005 | Faist et al. | |
| 7,036,209 | B1 * | 5/2006 | Wago et al. | 29/603.2 |
| 2004/0121545 | A1 * | 6/2004 | Chen | H01L 27/11521 438/266 |
| 2007/0164458 | A1 | 7/2007 | Ogino et al. | |
| 2009/0052488 | A1 * | 2/2009 | Sugiyama | B82Y 20/00 372/45.012 |
| 2009/0053656 | A1 * | 2/2009 | Yanagisawa | 430/323 |
| 2009/0243126 | A1 * | 10/2009 | Washiya | B29C 35/0888 264/2.5 |
| 2010/0009025 | A1 * | 1/2010 | Katsumura | B29C 33/38 425/470 |
| 2010/0034911 | A1 * | 2/2010 | Mori et al. | 425/89 |
| 2010/0096775 | A1 * | 4/2010 | Koh | B82Y 10/00 264/293 |
| 2010/0264560 | A1 * | 10/2010 | Zhang | B82Y 10/00 264/220 |
| 2010/0297795 | A1 * | 11/2010 | Ishihara | B82Y 20/00 438/31 |
| 2011/0012297 | A1 * | 1/2011 | Kobiki | B82Y 10/00 264/494 |
| 2011/0195276 | A1 | 8/2011 | Hu et al. | |

FOREIGN PATENT DOCUMENTS

| | | |
|---|---|---|
| JP | H10-4242 A | 1/1998 |
| JP | 2008-060396 A | 3/2008 |
| JP | 2008-177366 A | 7/2008 |
| JP | 2009-054637 A | 3/2009 |
| JP | 2009-164248 A | 7/2009 |
| JP | 2010-280065 A | 12/2010 |
| JP | 2011-119008 A | 6/2011 |
| JP | 2011-134870 A | 7/2011 |
| WO | WO 2010/044756 | 4/2010 |

OTHER PUBLICATIONS

Mattias Beck, et al., "Continuous Wave Operation of a Mid-Infrared Semiconductor Laser at Room Temperature," Science, vol. 295, Jan. 11, 2002, pp. 301-305.

A. Evans, et al., "Continuous-wave operation of $\lambda \sim -4.8$ μm quantum-cascade lasers at room temperature," Applied Physics Letters, vol. 85, No. 12, Sep. 20, 2004, pp. 2166-2168.

Claire Gmachl, et al., "Complex-Coupled Quantum Cascade Distributed-Feedback Laser," IEEE Photonics Technology Letters, vol. 9, No. 8, Aug. 1997, pp. 1090-1092.

Richard Maulini, et al., "Broadband tuning of external cavity bound-to-continuum quantum-cascade lasers," Applied Phisics Letters, vol. 84, No. 10, Mar. 8, 2004, pp. 1659-1661.

Alessandro Tredicucci, et al., "A multiwavelength semiconductor laser," Nature, vol. 396, Nov. 26, 1998, pp. 350-353.

J. S. Yu, et al., "High-power continuous-wave operation of a 6 μm quantum-cascade laser at room temperature," Applied Physics Letters, vol. 83, No. 13, Sep. 29, 2003, pp. 2503-2505.

A. Wittmann, et al., "Heterogeneous High-Performance Quantum-Cascade Laser Sources for Broad-Band Tuning," IEEE Journal of Quantum Electronics, col. 44, No. 11, Nov. 2008, pp. 1083-1088.

Andreas Wittmann, et al., "High-Performance Bound-to-Continuum Quantum-Cascade Lasers for Broad-Gain Applications," IEEE Journal of Quantum Electronics, vol. 44, No. 1, Jan. 2008, pp. 36-40.

A. Wittmann, et al., "Intersubband Linewidths in quantum cascade laser designs," Applied Physics Letters, vol. 93, 2008, pp. 141103-1-141103-3.

English-language translation of International Preliminary Report on Patentability (IPRP) dated May 8, 2014 that issued in WO Patent Application No. PCT/JP2012/067116.

\* cited by examiner

Fig.4

| SEMICONDUCTOR LAYER | | COMPOSITION | LAYER THICKNESS | DOPING |
|---|---|---|---|---|
| INJECTION BARRIER LAYER 171 | | InAlAs | 3.7nm | undoped |
| LIGHT EMITTING LAYER 17 | WELL LAYER 161 | InGaAs | 3.1nm | undoped |
| | BARRIER LAYER 172 | InAlAs | 2.7nm | undoped |
| | 162 | InGaAs | 7.5nm | undoped |
| | 173 | InAlAs | 0.9nm | undoped |
| | 163 | InGaAs | 5.8nm | undoped |
| | 174 | InAlAs | 1.0nm | undoped |
| | 164 | InGaAs | 5.2nm | undoped |
| EXIT BARRIER LAYER 191 | | InAlAs | 1.2nm | undoped |
| INJECTION LAYER 18 | WELL LAYER 181 | InGaAs | 4.1nm | undoped |
| | BARRIER LAYER 192 | InAlAs | 1.5nm | undoped |
| | 182 | InGaAs | 3.8nm | undoped |
| | 193 | InAlAs | 1.6nm | undoped |
| | 183 | InGaAs | 3.5nm | undoped |
| | 194 | InAlAs | 1.7nm | Si doped: $2 \times 10^{17}/cm^3$ |
| | 184 | InGaAs | 3.4nm | Si doped: $2 \times 10^{17}/cm^3$ |
| | 195 | InAlAs | 2.0nm | Si doped: $2 \times 10^{17}/cm^3$ |
| | 185 | InGaAs | 3.4nm | Si doped: $2 \times 10^{17}/cm^3$ |
| | 196 | InAlAs | 2.3nm | undoped |
| | 186 | InGaAs | 3.4nm | undoped |
| | 197 | InAlAs | 2.8nm | undoped |
| | 187 | InGaAs | 3.3nm | undoped |

Fig.13
(a)
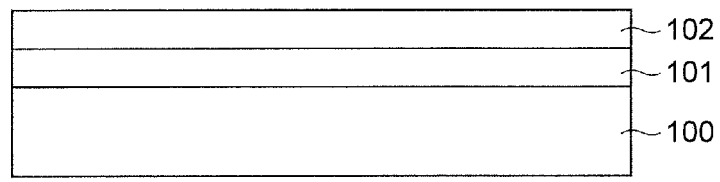
(b)
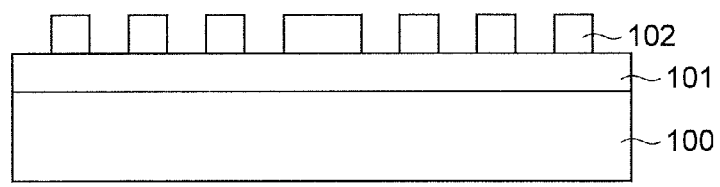
(c)
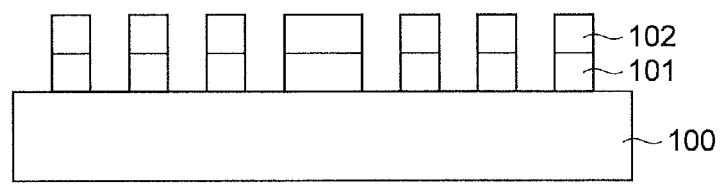
(d)
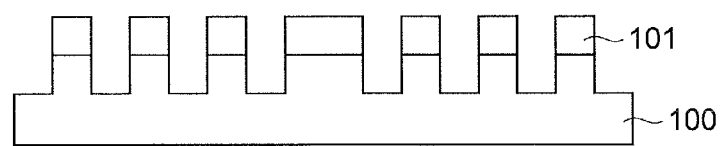

Fig.14
(a)
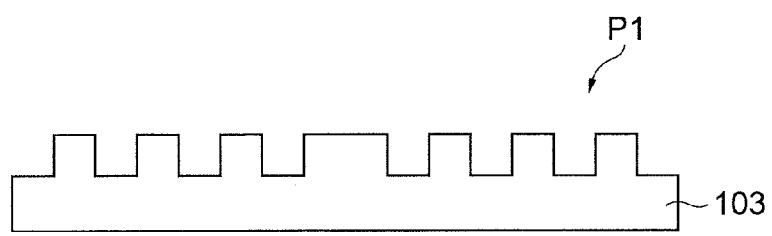
(b)
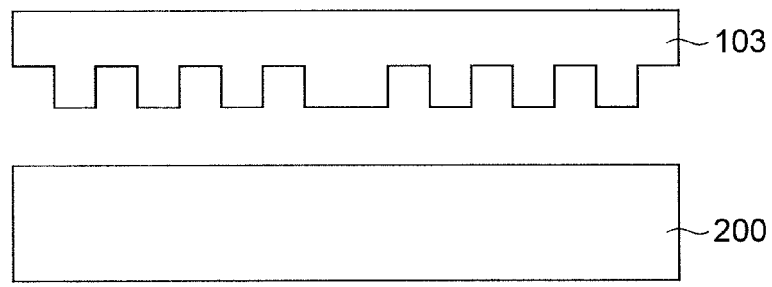
(c)
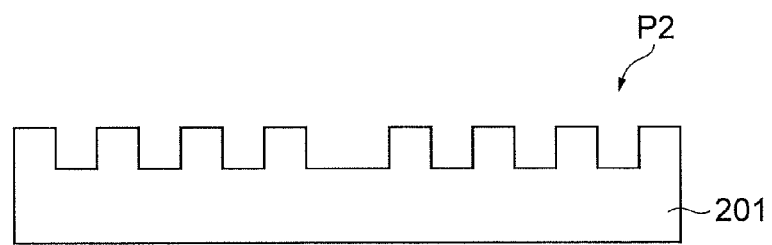

Fig.16
(a)
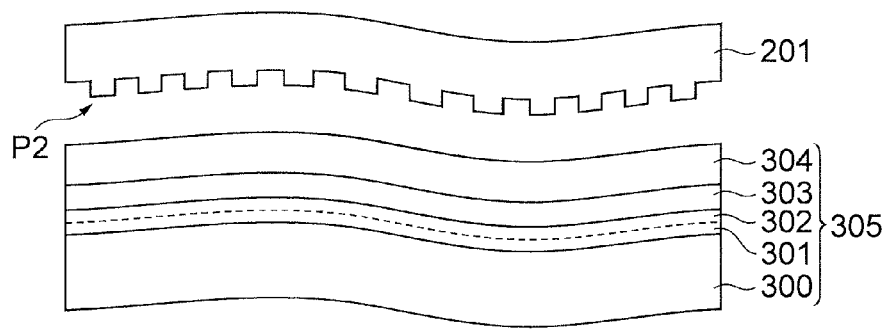
(b)
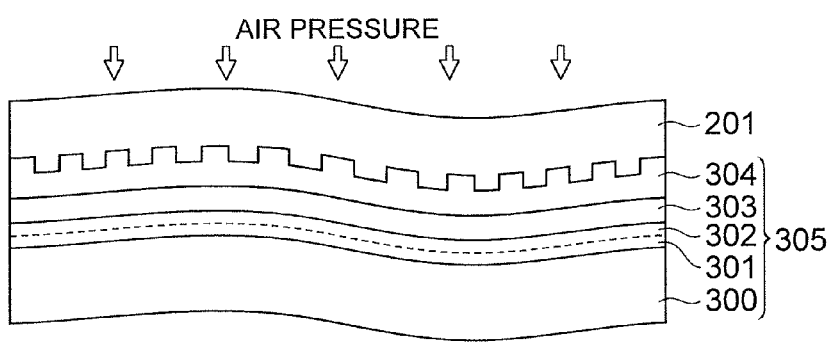
(c)
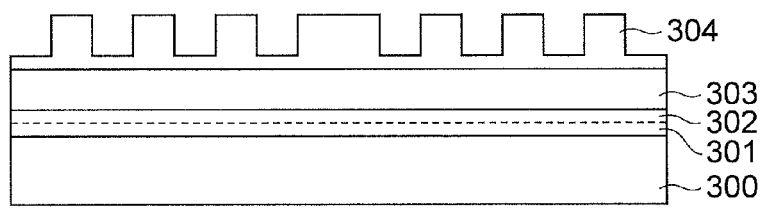
(d)
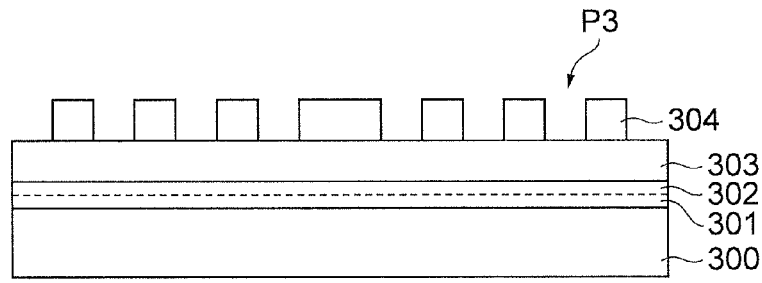

Fig.17
(a)
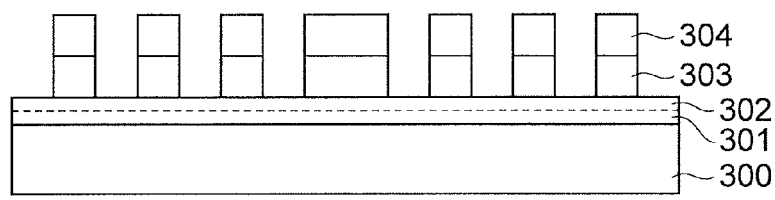
(b)
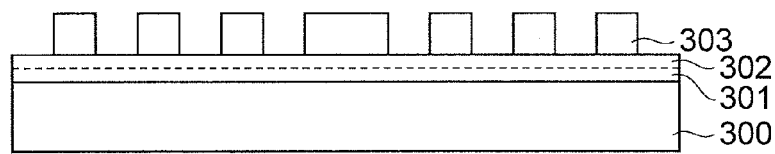
(c)
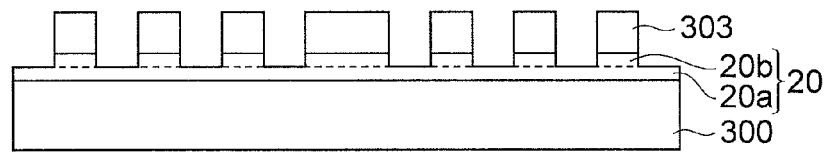
(d)
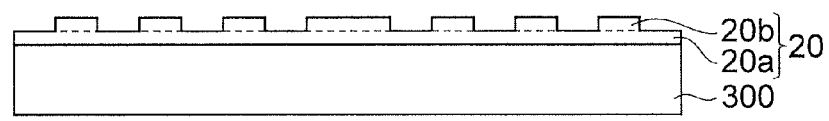

QUANTUM CASCADE LASER MANUFACTURING METHOD

TECHNICAL FIELD

The present invention relates to a quantum cascade laser manufacturing method.

BACKGROUND ART

Light in a mid-infrared wavelength range (wavelength of 5 µm to 30 µm, for example) is important in the field of spectroscopic analysis. In recent years, a quantum cascade laser (QCL) has been popular as a high performance semiconductor light source operating in the wavelength range (refer to Patent Literatures 1 to 8 and Non-Patent Literatures 1 to 9, for example).

The QCL is a unipolar laser utilizing a subband level structure formed in a semiconductor well structure to generate light through intersubband electron transition. The QCL has a cascade connection of a plurality of quantum well light emitting layers each having a quantum well structure that form an active region, thereby achieving high efficient and high output performance. The cascade connection of the quantum well light emitting layers is implemented by alternately stacking the quantum well light emitting layer and an electron injection layer, using the injection layer for injecting an electron into a light emission upper level.

CITATION LIST

Patent Literature

[Patent Literature 1] U.S. Pat. No. 5,457,709
[Patent Literature 2] U.S. Pat. No. 5,745,516
[Patent Literature 3] U.S. Pat. No. 6,751,244
[Patent Literature 4] U.S. Pat. No. 6,922,427
[Patent Literature 5] Japanese Patent Application Laid-Open Publication No. 8-279647
[Patent Literature 6] Japanese Patent Application Laid-Open Publication No. 2008-177366
[Patent Literature 7] Japanese Patent Application Laid-Open Publication No. 2008-60396
[Patent Literature 8] Japanese Patent Application Laid-Open Publication No. 10-4242

Non Patent Literature

[Non Patent Literature 1] M. Beck et al., "Continuous Wave Operation of a Mid-Infrared Semiconductor Laser at Room Temperature", Science Vol. 295 (2002), pp. 301-305
[Non Patent Literature 2] J. S. Yu et al., "High-Power Continuous-Wave Operation of a 6 µm Quantum-Cascade Laser at Room Temperature", Appl. Phys. Lett. Vol. 83 (2003), pp. 2503-2505
[Non Patent Literature 3] A. Evans et al., "Continuous-Wave Operation of λ~4.8 µm Quantum-Cascade Lasers at Room Temperature", Appl. Phys. Lett. Vol. 85 (2004), pp. 2166-2168
[Non Patent Literature 4] A. Tredicucci et al., "A Multiwavelength Semiconductor Laser", Nature Vol. 396 (1998), pp. 350-353
[Non Patent Literature 5] A. Wittmann et al., "Heterogeneous High-Performance Quantum-Cascade Laser Sources for Broad-Band Tuning", IEEE J. Quantum Electron. Vol. 44 (2008), pp. 1083-1088
[Non Patent Literature 6] A. Wittmann et al., "High-Performance Bound-To-Continuum Quantum-Cascade Lasers for Broad-Gain Applications", IEEE J. Quantum Electron. Vol. 44 (2008), pp. 36-40
[Non Patent Literature 7] R. Maulini et al., "Broadband Tuning of External Cavity Bound-to-Continuum Quantum-Cascade Lasers", Appl. Phys. Lett. Vol. 84 (2004), pp. 1659-1661
[Non Patent Literature 8] A. Wittmann et al., "Intersubband Linewidths in Quantum Cascade Laser Designs", Appl. Phys. Lett. Vol. 93 (2008), pp. 141103-1-141103-3
[Non Patent Literature 9] Claire Gmachl et al., "Complex-Coupled Quantum Cascade Distributed-Feedback Laser", IEEE Photon. Technol. Lett., Vol. 9 (1997), pp. 1090-1092

SUMMARY OF INVENTION

Technical Problem

In the QCL described above, the operation temperature of the device had been limited to extremely low temperatures when the QCL initially had succeeded in laser oscillation, although in 2002 M. Beck et al. achieved room temperature continuous wave (CW) operation at an oscillation wavelength of 9.1 µm (Non Patent Literature 1). After that, the room temperature CW operation was also achieved by M. Razeghi and his team at oscillation wavelengths of 6 µm and 4.8 µm (Non Patent Literatures 2 and 3). Nowadays the room temperature continuous oscillation has achieved in a wide range of wavelengths of 3.8 to 11.5 µm and reached at the stage of putting into practical use.

Following this successful room temperature continuous oscillation, efforts have been made to develop a QCL capable of single mode oscillation in a wide range of wavelengths by means of using a laser device with an external cavity (EC). Development has also been made for a distributed feedback (DFB) QCL capable of room temperature CW operation and scanning a single wavelength (refer to Non Patent Literature 9, for example).

In the conventional DFB QCL, device characteristics have been improved by concentrating the gain of light emission with a structure of generating light through electron intersubband transition from one light emission upper level into one light emission lower level (Patent Literature 6, for example). Specifically, such a structure allows laser operation to achieve a low threshold, high slope efficiency, and the room temperature CW operation.

In some cases, however, bimodal oscillation at both ends of a stop band occurs stemming from an error in the position of cleavage of the diffraction grating in manufacturing, which affects the yield. It has thus been desired to precisely manufacture the diffraction grating.

An objective of the present invention is thus to provide a method of manufacturing a QCL including a high-precision diffraction grating and capable of stably performing single mode oscillation.

Solution to Problem

A QCL manufacturing method according to an aspect of the present invention includes: a first step of preparing a mother stamper with a predetermined first groove pattern formed on a surface of a substrate; a second step of pressing the mother stamper against a resin film having flexibility to transfer the first groove pattern to the resin film and making a resin stamper with a second groove pattern formed on the resin film, the second groove pattern having an inverted asperity of the first groove pattern; a third step of making a wafer with an active layer formed on a semiconductor substrate, the active layer having a cascade structure in which a unit layered structure including a quantum well light emitting layer and an injection layer is stacked in multiples to alternately stack the quantum well light emitting layer and the injection layer; a fourth step of forming a resist film on a surface on the active layer side of the wafer; a fifth step of pressing the resin stamper against the resist film by air pressure to transfer the second groove pattern to the resist film and forming on the resist film a third groove pattern having an inverted asperity of the second groove pattern; and a sixth step of etching the wafer with the resist film serving as a mask to form a diffraction grating on a surface of the wafer.

A wafer for a QCL is typically a layered structure of a compound semiconductor. Its mechanical strength is thus not so high and its surface flatness is also unsatisfactory (the maximum of about 10 µm roughness in the wafer surface). In the QCL manufacturing method according to an aspect of the present invention, the resin stamper made of the resin film having flexibility is pressed against the resist film by air pressure to transfer the second groove pattern to the resist film. The wafer with low flatness is thus evenly pressured by the air pressure, whereby the second groove pattern of the resin stamper is transferred to the resist film markedly precisely. Accordingly, a high-precision diffraction grating is obtained, which allows manufacturing of the QCL capable of stably performing single mode oscillation.

In the QCL manufacturing method according to an aspect of the present invention, the mother stamper with the first groove pattern formed is pressed against the resin film to transfer the first groove pattern to the resin film, thereby making the resin stamper with the second groove pattern formed on the resin film, the second groove pattern having the inverted asperity of the first groove pattern. With the mother stamper made once, any number of the same resin stampers can be duplicated in a case of the resin stamper being damaged. The resin stamper can be used any number of times as long as it is not damaged.

In the QCL manufacturing method according to an aspect of the present invention, the resin stamper is made of the resin film having flexibility, and a plurality of diffraction gratings can be made at once on the wafer for the resin stamper with a large area. This can improve the mass production capacity of the QCL. A plurality of diffraction gratings with different periods can be made at once on the wafer depending on the second groove pattern of the resin stamper. The QCL capable of performing a plurality of kinds of single mode oscillation can be made from one wafer.

The diffraction grating formed on the surface of the wafer in the sixth step may be a phase shifting diffraction grating. Such a configuration prevents bimodal oscillation stemming from an error in the position of cleavage of the diffraction grating in manufacturing, which allows manufacturing of the QCL that stably performs single mode oscillation. A λ/4 phase shifting diffraction grating with the asperity phase of the diffraction grating inverted in the vicinity of the center of the diffraction grating is preferably adopted in particular, because the oscillation threshold gain is then only for one mode, the minimum mode.

After the third step and before the fourth step, another step may be included to form an intermediate film on the surface on the active layer side of the wafer. By selecting as the intermediate film a material giving the adhesion between the wafer and the resist film, a rip-off can be reduced. Rip-off is a phenomenon in which part of the third pattern is flaked off when the resin stamper is released from the resist film because of the adhesion between the resin stamper and part of the resist film. SiN or $SiO_2$ can be selected as a material of the intermediate film, for example.

An InP film may be formed on a surface on the active layer side of the wafer. An InGaAs film may then be formed on a surface of the InP film. With this configuration, the distance from the active layer to the InGaAs film can be adjusted through the thickness of the InP film. The InGaAs film is etched to function as a diffraction grating, and thus the coupling factor of the diffraction grating can be adjusted for a wavelength by adjusting the thickness of the InP film as a base. The InP film functions as a stopper during etching of the InGaAs film, thereby allowing a markedly precise control of the groove depth of the diffraction grating.

The resist film may be formed of ultraviolet curable resin and the resin stamper may have ultraviolet transparency. With this configuration, while the resin stamper is press-bonded to the resist film, ultraviolet light can be applied through the resin stamper to the resist film.

Advantageous Effects of Invention

The present invention provides a method of manufacturing a QCL including a high-precision diffraction grating and capable of stably performing single mode oscillation.

BRIEF DESCRIPTION OF DRAWINGS

FIG. 4 is a table for an example configuration of the unit layered structure for one period in the active layer.

FIG. 13 is a diagram illustrating the process of making a mother stamper and a resin stamper.

FIG. 14 is a diagram illustrating the process of making the mother stamper and the resin stamper.

FIG. 16 is a diagram illustrating the process of making a phase shifting diffraction grating.

FIG. 17 is diagram illustrating the process of making the phase shifting diffraction grating.

DESCRIPTION OF EMBODIMENTS

The following describes preferred embodiments of the present invention with reference to the accompanying drawings. The same numeral denotes the same element or an element having the same function, and any redundant description will be omitted.

The Entire Configuration of a QCL

Figure 1:
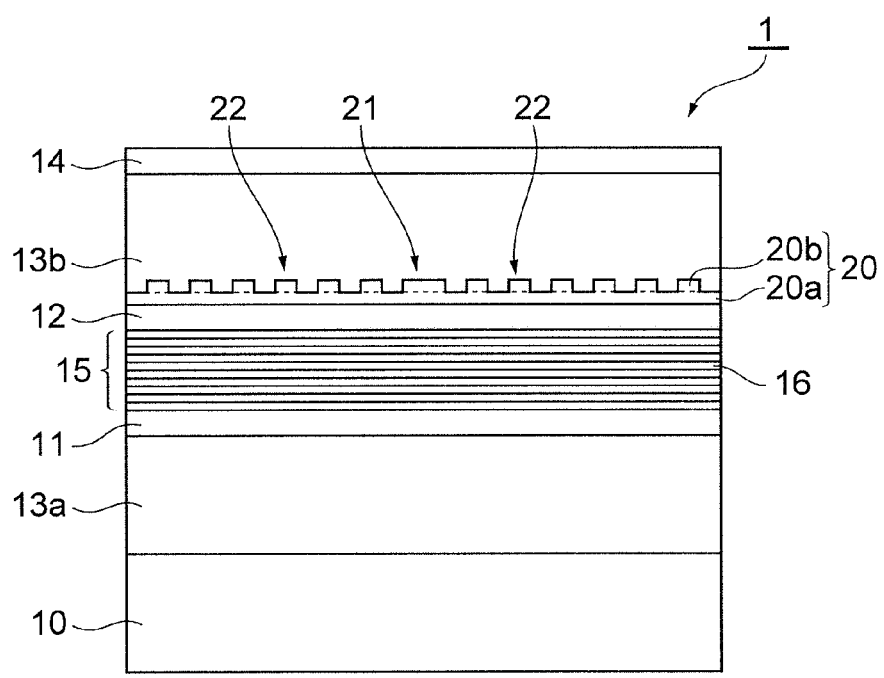
FIG. 1 is a diagram illustrating the configuration of a QCL according to an embodiment of the present invention.

A QCL 1 according to the present embodiment is a unipolar laser device that generates light through intersubband electron transition in a semiconductor quantum well structure. The QCL 1 has a configuration in which a cladding layer 13a, a lower core layer 11, an active layer 15, an upper core layer 12, a diffraction grating layer 20, a cladding layer 13b, and a contact layer 14 are sequentially stacked on a semiconductor substrate 10 in this order from the semiconductor substrate 10 side as illustrated in FIG. 1.

The Configuration of the Active Layer

The active layer 15 has a cascade structure in which a quantum well light emitting layer used for generating light and an electron injection layer used for injecting an electron into the light emitting layer are alternately stacked in multiples. A semiconductor layered structure including the quantum well light emitting layer and the injection layer is taken as a unit layered structure 16 for one period, and the unit layered structure 16 is stacked in multiples to construct the active layer 15 having a cascade structure. The number of stacks of the unit layered structures 16 including the quantum well light emission layer and the injection layer is set as appropriate, for example, in the hundreds. The active layer 15 is disposed on the semiconductor substrate 10 through the lower core layer 11 in the present embodiment, but may be disposed directly on the semiconductor substrate 10.

Figure 2:
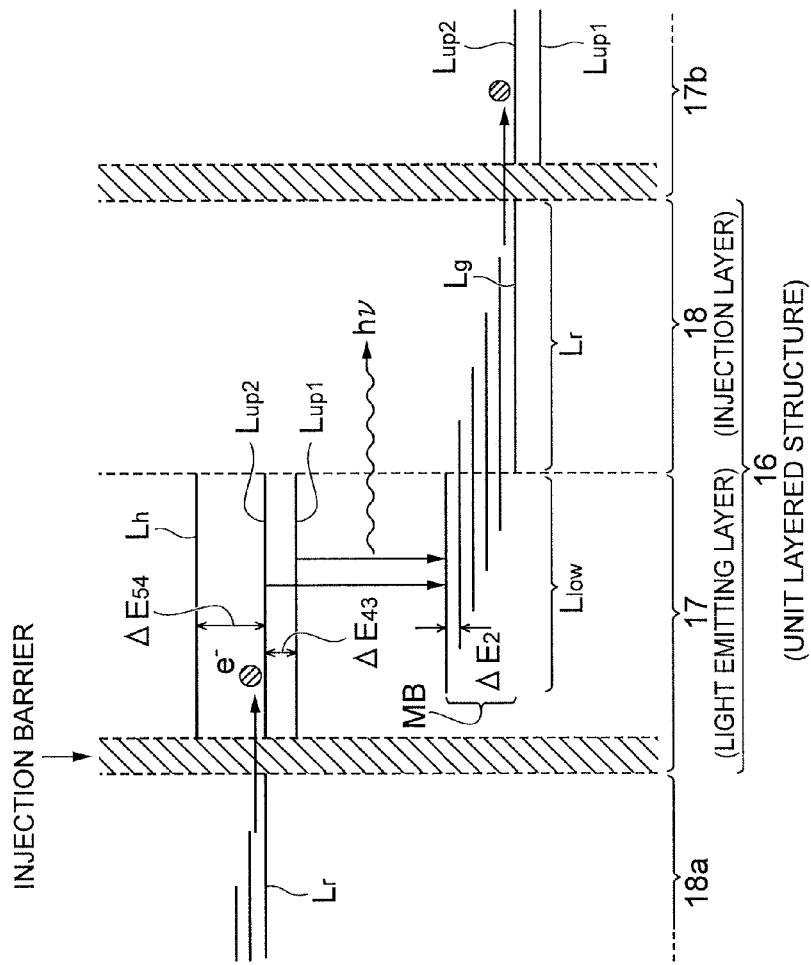
FIG. 2 is a diagram illustrating a subband level structure of an active layer of the QCL.

Each of the unit layered structures 16 included in the active layer 15 includes the quantum well light emitting layer 17 and the electron injection layer 18 as illustrated in FIG. 2. The light emitting layer 17 and the injection layer 18 each have a certain quantum well structure including a quantum well layer and a quantum barrier layer. This configuration forms a subband level structure that is an energy level structure due to a quantum well structure in the unit layered structure 16.

The subband level structure formed in the unit layered structure 16 includes a first light emission upper level (level 3) $L_{up1}$, a second light emission upper level (level 4) $L_{up2}$, and a plurality of light emission lower levels (levels 2) $L_{low}$ as illustrated in FIG. 2. The second light emission upper level $L_{up2}$ has a higher energy than the first light emission upper level $L_{up1}$. The light emission lower levels $L_{low}$ have lower energies than the first light emission upper level $L_{up1}$.

The light emitting layer 17 includes n (n is an integer equal to or greater than two) well layers. One of the first light emission upper level $L_{up1}$ and the second light emission upper level $L_{up2}$ is a level attributable to the ground level of the first well layer on an injection layer 18a side of the first period, and the other is a level attributable to an excited level of the well layers except for the first well layer (the second to the n-th well layers).

The energy difference $\Delta E_{43}$ between the first light emission upper level $L_{up1}$ and the second light emission upper level $L_{up2}$ is set to be smaller than the energy $E_{LO}$ of the longitudinal optical (LO) phonon ($\Delta E_{43} < E_{LO}$). A high energy level (level 5) $L_h$ is adjacent to and higher than the second light emission upper level $L_{up2}$. The energy difference $\Delta E_{54}$ between the second light emission upper level $L_{up2}$ and the high energy level $L_h$ is set to be larger than the energy $E_{LO}$ of the LO phonon ($E_{LO} < \Delta E_{54}$).

The energy $E_{LO}$ of the LO phonon is, for example, 34 meV for InGaAs as the semiconductor material of the quantum well layer. The energy $E_{LO}$ of the LO phonon is 36 meV for the quantum well layer of GaAs and 32 meV for the quantum well layer of InAs, the energies approximately equal to 34 meV described above.

The two light emission upper levels $L_{up1}$ and $L_{up2}$ are preferably designed so that the energies of the levels are equal and their wave functions are strongly coupled (anticrossing) in the presence of an operational electric field. With this configuration, these two upper levels behave as if they are a single light emission upper level having a range in energies. By controlling the coupling strength between the two upper levels, it is possible to control the full width at half maximum (FWHM) of light emission. The light emission lower levels $L_{low}$ constitute a lower miniband MB including a plurality of levels, and a light emitting transition from the first light emission upper level and the second light emission upper level disperses to the lower miniband.

The unit layered structure 16 illustrated in FIG. 2 includes an injection barrier layer provided between the light emitting layer 17 and the injection layer 18a of the unit layered structure of the previous period. The injection barrier layer is an injection barrier for an electron injected from the injection layer 18a into the light emitting layer 17. An exit barrier layer may be provided between the light emitting layer 17 and the injection layer 18. The exit barrier layer is an exit barrier for an electron from the light emitting layer 17 into the injection layer 18. FIG. 2 illustrates a configuration in which simply a thin barrier layer is provided between the light emitting layer 17 and the injection layer 18, thin enough to allow the wave function to leak through it sufficiently.

The miniband MB has a band structure with a plurality of levels extending from the light emitting layer 17 to the injection layer 18, the band structure resulting from the coupling between the miniband in the quantum well light emitting layer 17 and the miniband in the injection layer 18. Of the miniband MB, the higher energy portion in the light emitting layer 17 functions as the lower miniband consisting of the light emission lower levels $L_{low}$ described above, whereas the lower energy portion in the injection layer 18 functions as a relaxation miniband including a relaxation level (level 1) $L_r$ that allows an electron having undergone a light emitting transition to be relaxed from the light emission lower levels $L_{low}$ into a light emitting layer 17b of the subsequent period.

The light emission lower levels $L_{low}$ and the relaxation level $L_r$, which are continuous levels, allow a markedly high efficient generation of the population inversion. The ground level $L_g$ in the injection layer 18 among the relaxation levels $L_r$ constituting the relaxation miniband is preferably designed to strongly couple with the second light emission upper level $L_{up2}$ in the light emitting layer 17b of the unit layered structure of the subsequent period in the presence of an operational electric field.

An electron $e^-$ at the relaxation level $L_r$ in the injection layer 18a of the previous period is injected into the light emitting layer 17 through the injection barrier owing to the resonant tunneling effect. This markedly strongly populates the second light emission upper level $L_{up2}$ coupled with the relaxation level $L_r$. At the same time, the first light emission upper level $L_{up1}$ is supplied with sufficient electrons through a fast scattering process such as an electron-electron scattering, and thus the two light emission upper levels $L_{up1}$ and $L_{up2}$ are supplied with sufficient carriers.

Electrons injected into the first light emission upper level $L_{up1}$ and the second light emission upper level $L_{up2}$ transit to the light emission lower levels $L_{low}$ constituting the lower miniband. Through this, light hv having the wavelength corresponding to the energy difference between the upper levels $L_{up1}$ and $L_{up2}$ and the lower levels $L_{low}$ is generated and emitted. As described above, the two upper levels behave as if they are a single light emission level having a range in energies, and thus the obtained light emitting spectrum is an evenly distributed spectrum. FIG. 2 only illustrates a light emitting transition from the upper levels $L_{up1}$ and $L_{up2}$ to the highest lower level $L_{low}$ and omits illustration of transitions to the other lower levels.

The electron transited to the light emission lower level $L_{low}$ is then relaxed fast through interminiband relaxation by the LO phonon scattering, the electron-electron scattering, and other interactions within the miniband MB including the light emission lower levels $L_{low}$ and the relaxation levels $L_r$ in the injection layer 18. Through such an extraction of a carrier from the light emission lower level $L_{low}$ through interminiband relaxation, the population inversion to achieve laser oscillation is easily generated between the two upper levels $L_{up1}$ and $L_{up2}$ and the lower levels $L_{low}$. An electron relaxed from the light emission level $L_{low}$ to the level $L_r$ in the injection layer 18 is injected via the ground level $L_g$ in the injection layer 18, which is a relaxation level on a lower energy side, to the light emission upper levels $L_{up1}$ and $L_{up2}$ in the light emitting layer 17b of the subsequent period in a cascade manner.

Through repetition of the injection, the light emitting transition, and the relaxation in the unit layered structures 16 included in the active layer 15, light generation occurs in the active layer 15 in a cascade manner. In other words, with large numbers of the quantum well light emitting layers 17 and the injection layers 18 alternately stacked, an electron is allowed to move sequentially through the layered structures 16 in a cascade manner and generates light h through intersubband transition in each of the layered structures 16. Such light is resonated in an optical resonator to generate a laser light of a certain wavelength.

The Configuration of the Diffraction Grating Layer

Back in FIG. 1, the diffraction grating layer 20 includes a base 20a disposed on the active layer 15 through the upper core layer 12 and a plurality of protrusions 20b disposed on the base 20a. The base layer 20a is formed on the entire surface of the upper core layer 12. The base layer 20a functions as an etching stopper when the protrusions 20b are fabricated by etching, and have a function of adjusting the distance from the active layer 15 to the protrusions 20b.

The protrusions 20b are arranged mutually and equally separate to form a certain pattern on the base 20a. When a target wavelength is 5.26 μm (wavenumber is 1901 cm$^{-1}$), the pitch of the protrusions 20b can be set to 824 nm utilizing the first order diffraction. A protrusion 21 located about the center in the width direction of the QCL 1 has its width set to about twice as that of the other protrusions 22 as illustrated in FIG. 1. As a result of the protrusions 21 thus functioning as a phase shifting portion, the protrusions 20b (the diffraction grating layer 20) function as a λ/4 phase shifting diffraction grating. The cladding layer 13b is formed to fill the gaps between the protrusions 20b.

The protrusions 20b can be formed by nanoimprint lithography described in detail later. The gap (period) between the protrusions 20b is 824 nm approximately when the target wavelength is 5.26 μm (wavenumber is 1901 cm$^{-1}$), for example, and the accuracy of manufacturing the diffraction grating is ±0.8 nm or less. The nanoimprint lithography enables highly accurate manufacturing of a phase shifting diffraction grating with a large area, thereby preventing the bimodal oscillation.

Figure 3:
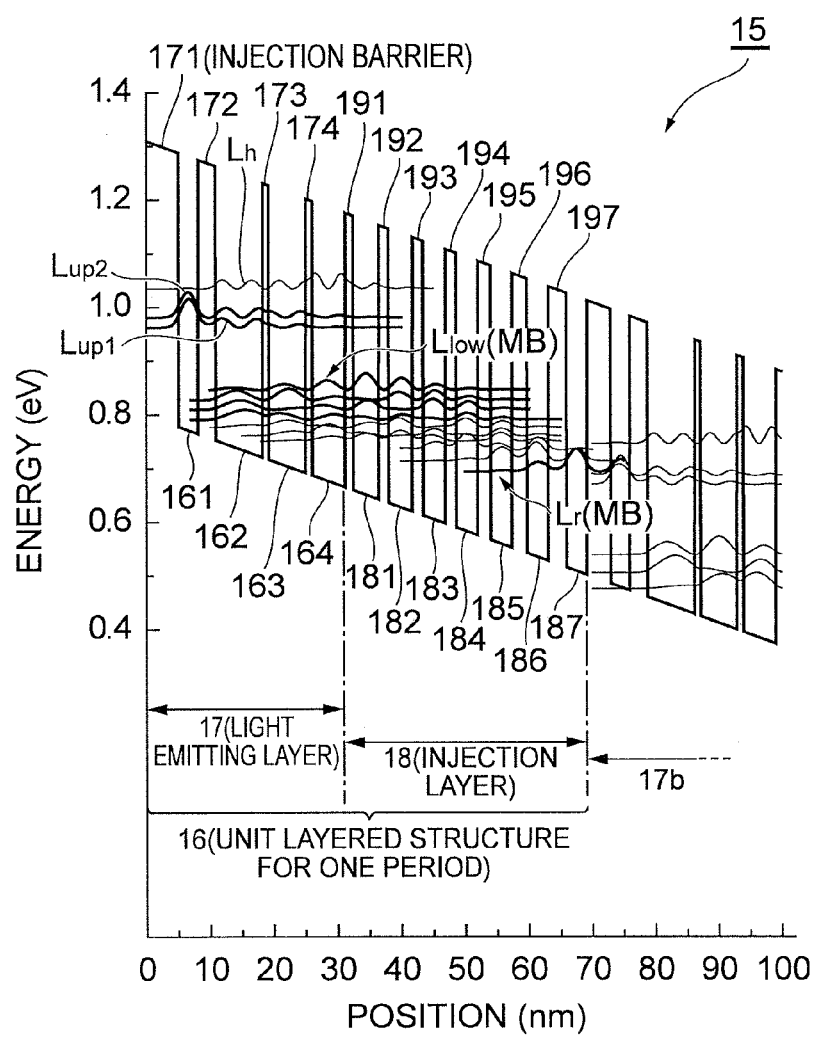
FIG. 3 is a diagram illustrating an example of the configuration of a unit layered structure included in the active layer.

A Specific Example of the Structure of a Device Including the Quantum Well Structure in the Active Layer The following describes a specific example of the structure of a device including the quantum well structure in the active layer with reference to FIGS. 1, 3, and 4.

The semiconductor substrate 10 according to the present configuration example is made of an n-type InP single crystal. The cladding layers 13a and 13b are made of InP, and their thicknesses may be set to 3.5 μm approximately. The lower core layer 11 is made of InGaAs, and its thickness may be set to 300 nm approximately. The upper core layer 11 is made of InGaAs, and its thickness may be set to 300 nm approximately. The contact layer 14 is made of InGaAs, and its thickness may be set to 10 nm approximately. The base layer 20a is made of InP, and its thickness may be set to 200 nm to 300 nm approximately. The protrusions 20b are made of InGaAs, and their thickness may be set to 100 nm approximately.

The quantum well structure of the active layer 15 according to the present configuration example has its oscillation wavelength set to 8.7 μm (oscillation energy: 142 meV) and the operational electric field set to 41 kV/cm, for example. FIG. 3 illustrates the quantum well structure and the subband level structure for part of the repeated structure of the multiples of the light emitting layer 17 and the injection layer 18 in the active layer 15. The device structure illustrated in FIGS. 1 and 3 can be formed through crystal growth by molecular beam epitaxy (MBE) or metalorganic vapor phase epitaxy (MOVPE).

The active layer 15 according to the present configuration example includes 40 periods of the unit layered structure 16 consisting of the quantum well light emitting layer 17 and the electron injection layer 18. The structure of the unit layered structure 16 for one period is a quantum well structure in which 11 of the quantum well layers 161 to 164 and 181 to 187 and 11 of the quantum barrier layers 171 to 174 and 191 to 197 are alternately stacked as illustrated in FIG. 3.

Among these semiconductor layers of the unit layered structure 16, the quantum well layers are made of $In_{0.53}Ga_{0.47}As$ layers. The quantum barrier layers are made of $Al_{0.52}In_{0.48}As$ layers. The structure of the active layer 15 is thus an InGaAs/InAlAs structure lattice-matched to the InP substrate 50.

As illustrated in FIG. 3, in the unit layered structure 16, a layered portion consisting of the four well layers 161 to 164 and the four barrier layers 171 to 174 mainly functions as the light emitting layer 17. In the unit layered structure 16, a layered portion consisting of the seven well layers 181 to 187 and the seven barrier layers 191 to 197 mainly functions as the injection layer 18. Among the semiconductor layers of the light emitting layer 17, the first quantum barrier layer 171 is positioned between the injection layer of the previous period and the light emitting layer 17 and functions as an injection barrier layer for an electron from the injection layer of the previous period into the light emitting layer 17.

In the present configuration example, the exit barrier layer is positioned between the light emitting layer 17 and the injection layer 18 but does not practically function as an exit barrier for an electron from the light emitting layer 17 into the injection layer 18. In FIG. 3, the wave functions of the light emission upper levels $L_{up1}$ and $L_{up2}$ decay before the fifth barrier layer 191 of the unit layered structure 16, which is practically taken as an exit barrier layer to functionally separate the light emitting layer 17 and the injection layer 18 before and after the exit barrier layer. FIG. 4 illustrates an example of the configuration of the unit layered structure 16 for one period in the active layer 15.

The unit layered structure 16 has the subband level structure illustrated in FIG. 3 that has the first light emission upper level (level 3) $L_{up1}$, the second light emission upper level (level 4) $L_{up2}$, the light emission lower levels (levels 2) $L_{low}$, and the relaxation levels $L_r$ (level 1). The level structure in FIG. 3 has 12 levels contributing laser operation, of which a plurality of levels correspond to the light emission lower levels $L_{low}$ and the relaxation levels $L_r$. As described above, the light emission lower levels and the relaxation levels form the miniband MB of a plurality of levels extending from the light emitting layer 17 to the injection layer 18. The thicknesses of the well layers and the barrier layers in the light emitting layer 17 and the injection layer 18 are quantum mechanically designed.

A Specific Procedure of Designing the Quantum Well Structure

The following describes a specific procedure of designing the quantum well structure of the unit layered structure 16. First, the energy difference between the first light emission upper level (level 3) $L_{up1}$ and the light emission lower levels (level 2) $L_{low}$, and the configuration of extracting an electron from the light emission lower levels are determined to give the oscillation wavelength of the laser device. The subband level structure described above has the lower miniband consisting a plurality of levels as the light emission lower levels $L_{low}$.

The energy difference between the first light emission upper level $L_{up1}$ and the lower miniband including the light emission lower levels $L_{low}$ is determined by the well widths of the well layers 161 to 164 in the light emitting layer 17, the thicknesses of the barrier layers 172 to 174 in the light emitting layer 17, and the operational electric field. The operational electric field is set based on the expected layer thickness and voltage drop of the layered structure for one period. In the present configuration example, as described above, the operational electric field is set to 41 kV/cm.

The well widths of the well layers 161 to 164, the thicknesses of the barrier layers 172 to 174, and the thickness of the barrier layer 191 of the injection layer 18, which determine the emission wavelength, cannot be determined independently. This is because the wave functions of the levels are sensitively affected by the quantum well layers and the barrier layers. For these semiconductor layers, their thicknesses are quantum mechanically determined through numerical calculation. The design wavelength will change at the next design step of determining the level position of the second light emission upper level $L_{up2}$, and thus the configuration of the quantum well layers 162 to 164 and the barrier layers 173 and 174 is roughly determined here.

The well width of the quantum well layer 161 is then determined to set the second light emission upper level (level 4) $L_{up2}$. The thickness of the well layer 161 as the first well layer of the light emitting layer 17 is naturally smaller than those of the other well layers of the light emitting layer 17 because the ground level of the first well layer 161 as a single quantum well layer corresponds to the second light emission upper level $L_{up2}$.

The first light emission upper level $L_{up1}$ and the second light emission upper level $L_{up2}$ need to have their wave functions coupled and overlapped sufficiently in the presence of the operational electric filed. The thickness of the first well layer 161 is thus set for the ground level of the well layer 161 and the first light emission upper level $L_{up1}$ to have substantially the same energy in the presence of the operational electric field. In this case, the first light emission upper level $L_{up1}$ is an excited level of the well layers other than the first well layer 161.

The thickness of the second barrier layer 172 determines the size of anticrossing when the first light emission upper level $L_{up1}$ and the second light emission upper level $L_{up2}$ are coupled (the energy difference $\Delta E_{43}$ between the level 3 and the level 4 when the levels are completely coupled). The size of anticrossing is large for the thin barrier layer 172 and small for the thick barrier layer 172.

The QCL according to an aspect of the present invention achieves a wide FWHM of light emission by controlling transition from the first light emission upper level $L_{up1}$ and the second light emission upper level $L_{up2}$ to the light emission lower levels $L_{low}$. Such function deteriorates for an inappropriate thickness of the barrier layer 172. When the barrier layer 172 is too thin, $\Delta E_{43}$ is large, which causes a transition to the light emission lower level $L_{low}$ to be weighted in a transition to either of the first light emission upper level $L_{up1}$ and the second light emission upper level $L_{up2}$, resulting in a narrow FWHM of light emission. Even if light emission occurs without such weighting, its emission spectrum is nonuniform as in an interminiband transition.

In contrast, when the barrier layer 172 is too thick, $\Delta E_{43}$ is too small. When there exists any barrier layer thicker than the injection barrier layer 171 in the cascade structure, it is difficult to transport carriers, which may deteriorate the laser operation. With these considerations, the thickness of the barrier 172 needs to be appropriately set smaller than that of the injection barrier layer 171. In the configuration example illustrated in FIG. 4, the thickness of the barrier layer 172 is set to 2.7 nm to set the energy difference $\Delta E_{43}$ between the light emission upper levels $L_{up1}$ and $L_{up2}$ to 18 meV.

As described above, the miniband MB serves as the light emission lower levels $L_{low}$. In the miniband MB, there are a number of levels with their wave functions extending in space. To achieve such a configuration, all the barrier layers included in the light emitting layer 17 need to have a thin thickness, thereby strongly coupling their levels.

The levels existing in the electron injection layer 18 are also used as levels included in the miniband MB, and thus the thickness of the first barrier layer (exit barrier layer) 191 of the injection layer 18 needs to be set small to allow the wave functions of these levels to leak into the light emitting layer 17. The exit barrier layer 191 needs to be carefully designed because its too large thickness would not only deteriorate electron flow from the light emitting layer 17 to the injection layer 18 but also prevent formation of the lower miniband MB. In the present configuration example, as described above, the first barrier layer 191 does not function as an effective exit barrier.

In the process of designing the quantum well structure, the design wavelength and the separation between the levels keep changing, but every time when a change happens a fine adjustment is carried out to eventually determine all the thicknesses of the quantum well layers and the barrier layers in the light emitting layer 17. As a result, the thicknesses of the well layers 161 to 164 are set to 3.1 nm, 7.5 nm, 5.8 nm, and 5.2 nm, respectively. The thicknesses of the barrier layers 172 to 174 and the barrier layer 191 of the injection layer 18 are set to 2.7 nm, 0.9 nm, 1.0 nm, and 1.2 nm, respectively.

The electron injection layer 18 is designed below. In the present configuration example, a funnel injector (Patent Literature 8: Japanese Patent Application Laid-Open Publication No. 10-4242) is employed as the structure of the injection layer 18. By employing the funnel injector, the energy differences of the miniband MB can be narrowed toward the subsequent period, thereby enhancing the injection efficiency of an electron into the second light emission upper level $L_{up2}$. This level structure can be achieved by making the thicknesses of the quantum well layers smaller and the thicknesses of the barrier layers larger in the injection layer 18 from the light emitting layer 17 side toward the light emitting layer 17b of the subsequent period.

In designing the injection layer 18 illustrated in FIG. 3, the design needs to start with the quantum well layer 187 adjacent to the light emitting layer 17b of the subsequent period. This is because the wave function of the level existing in the well layer 187 (the ground level in the injection layer 18 in the presence of the operational electric field) needs to be configured to follow that of the light emission upper level under any electric field lower than the operational electric field.

To achieve such a configuration, the thickness of the well layer 187 needs to be slightly (a several angstrom) larger than that of the well layer 161. In the present configuration example, for the thickness of the well layer 161 of the light emitting layer 17 set to 3.1 nm, the thickness of the well layer 187 of the injection layer 18 is set to 3.3 nm. This enables excitation of the second light emission upper level $L_{up2}$ through electron injection from the relaxation miniband, thereby achieving a wide FWHM of light emission.

The following considers a case where the well layer 187 is thicker than the well layer 161 by 6 Å (0.6 nm, two atomic layer). In the presence of a low electric field, the relaxation levels in the well layer 187 are not only lower than the second light emission upper level $L_{up2}$ in the well layer 161 but also lower than the first light emission upper level $L_{up1}$. In such a level structure, when the electric field becomes close to the operational electric field, an electron is first injected into the first light emission upper level $L_{up1}$, which makes it difficult to have a wide FWHM of light emission.

After the thickness of the well layer 187 is determined, the thicknesses of the other quantum well layers and the barrier layers in the injection layer 18 are determined by the same method conventionally done. The thickness of the first barrier layer 191 of the injection layer 18 is set as described above.

Among the semiconductor layers included in the injection layer 18, the thicknesses of the well layers and the barrier layers on the exit barrier layer 191 side are designed accordingly to enable transporting of all electrons from the levels existing in the light emitting layer 17 to the miniband in the injection layer 18. In contrast, for the thicknesses of the well layers and the barrier layers on the injection barrier layer 171 of the subsequent period, the relaxation miniband needs to be narrowed sufficiently to allow electrons from the injection layer 18 to be injected into the second light emission upper level $L_{up2}$ of the subsequent period but not into the level $L_h$ on a higher energy side.

As a result of designing with the above points taken into consideration, the thicknesses of the well layers 181 to 187 are set to 4.1 nm, 3.8 nm, 3.5 nm, 3.4 nm, 3.4 nm, 3.4 nm, and 3.3 nm, respectively. The thicknesses of the barrier layers 192 to 197 are set to 1.5 nm, 1.6 nm, 1.7 nm, 2.0 nm, 2.3 nm, and 2.8 nm, respectively.

The following determines the thickness of the injection barrier layer 171 in the quantum well light emitting layer 17. The barrier layer 171 determines the coupling strength between the periods in the cascade structure of the unit layered structures 16 and determines the maximum current to flow. The coupling strength between the wave functions is determined by the anticrossing gap, and in the present configuration example the anticrossing gap is designed to be 7.3 meV to allow an equivalent current to the conventional technology to flow. The thickness of the injection barrier layer 171 thus designed is 3.7 nm.

The Characteristics and Other Specifications of the QCL

The following describes the characteristics and other specifications of the QCL according to the configuration example designed as described above with reference to FIGS. 5 to 8.

Figure 5:
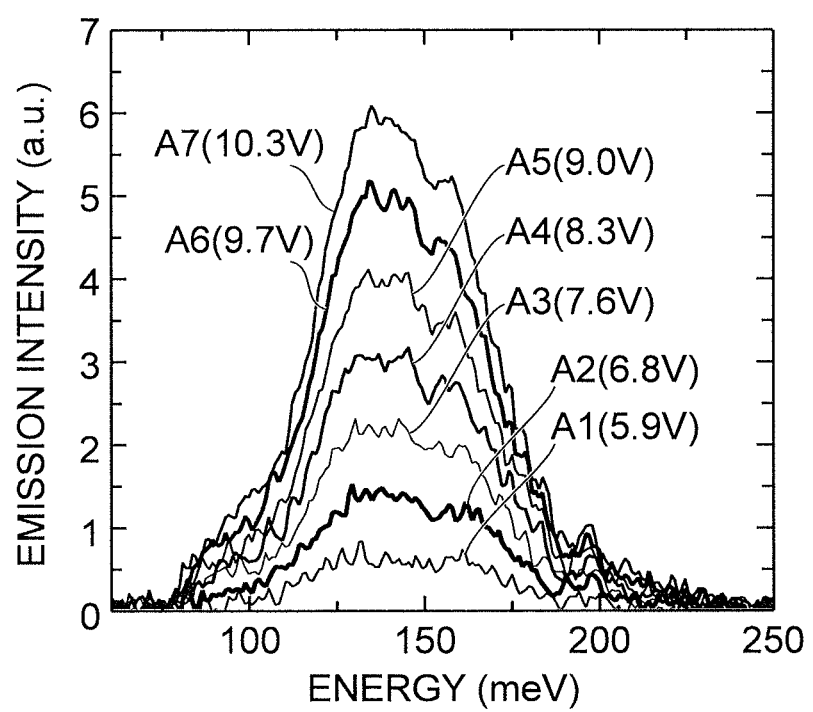
FIG. 5 is a graph of an emission spectrum obtained with the QCL.

FIG. 5 is a graph illustrating the operational voltage dependency of an emission spectrum obtained with the QCL. In the graph, the abscissa represents the emission energy (meV) and the ordinate represents the emission intensity (a.u.). Graphs A1 to A7 represent the emission spectra at applied voltages of 5.9 V, 6.8 V, 7.6 V, 8.3 V, 9.0 V, 9.7 V, and 10.3 V, respectively. As illustrated in Graphs A1 to A7, by adopting the level structure described above (dual-state-to-continuum structure) in the active layer, its emission spectrum exhibits a wide and flat emission. The FWHM of light emission in this case is equivalent to that of a two-stack bound-to-continuum (BTC) structure, and a wide and high quality emission is achieved by a single design recipe.

Figure 6:
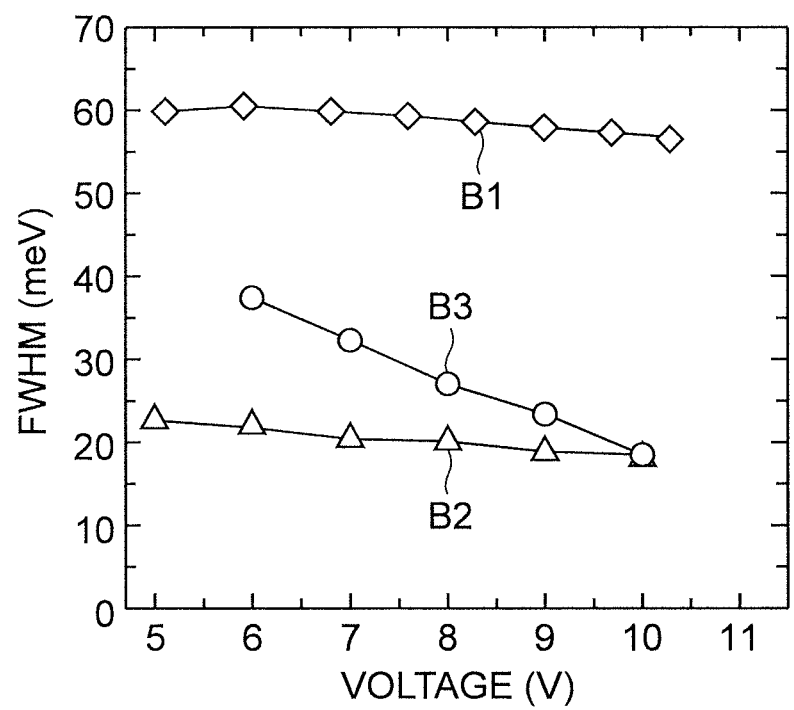
FIG. 6 is a graph illustrating the voltage dependency of a full width at half maximum of light emission.

FIG. 6 is a graph illustrating the voltage dependency of the FWHM of light emission (FWHM of the emission spectrum). In this graph, the abscissa represents the applied voltage (V) and the ordinate represents the FWHM (meV), which is the full width half maximum. The graphs represent operational examples at an operational temperatures of 300 K (Graph B1) and 303 K (Graphs B2 and B3). Graphs (data plots) B1 to B3 illustrate the voltage dependencies of the FWHM of light emission when the novel structure described above, the conventional bound-to-bound structure, and the BTC structure are adopted respectively.

As illustrated in Graphs B1 to B3, a markedly large FWHM of light emission is obtained for the novel structure described above as compared to the other structures. The voltage dependency of the FWHM of light emission shows that the FWHM of light emission decreases for the BTC structure as the voltage increases. In contrast, the FWHM of light emission is substantially constant for the novel structure and the voltage dependency is significantly small. This suggests that the novel structure described above has a markedly high superiority in being adopted in laser devices such as DFB type and EC type.

The QCL having the structure described above exhibits sufficient characteristics and functionalities in light emitting transition from the first light emission upper level $L_{up1}$ and the second light emission upper level $L_{up2}$ to the light emission lower levels $L_{low}$ only when a sufficient strength of transition from the two levels $L_{up1}$ and $L_{up2}$ is obtained as described above. The two upper levels therefore need to be sufficiently coupled in operation and their wave functions need to extend over the entire light emitting layer 17. One of the first light emission upper level and the second light emission upper level is usually localized in the first well layer of the light emitting layer 17 and has its wave function extended over the entire light emitting layer 17 only when coupled with the other upper level.

Figure 7:
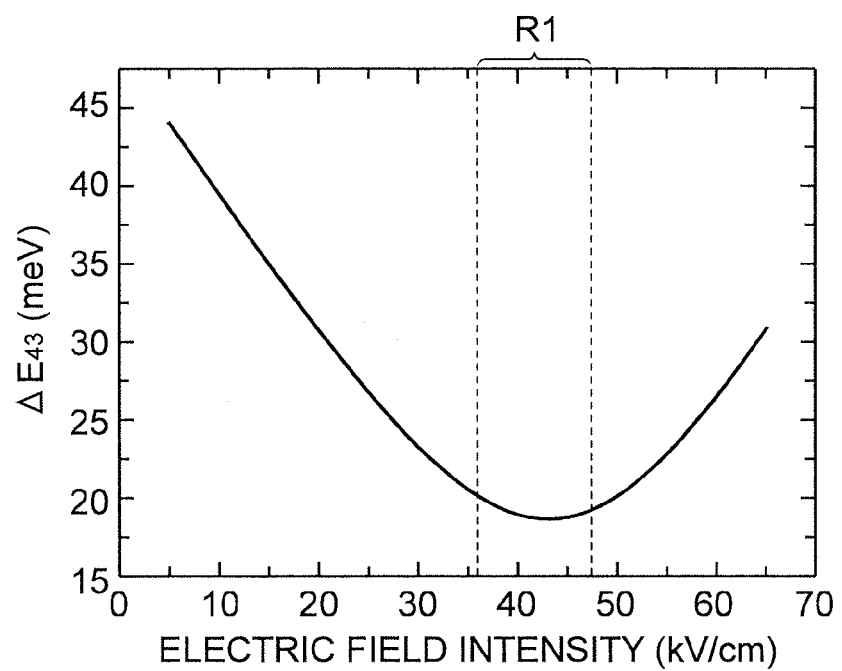
FIG. 7 is a graph illustrating the electric field intensity dependency of the energy difference between a first light emission upper level and a second light emission upper level.

FIG. 7 is a graph illustrating the electric field intensity dependency of the energy difference between the first light emission upper level $L_{up1}$ and the second light emission upper level $L_{up2}$. In this graph, the abscissa represents the electric field intensity (kV/cm) applied to the active layer 15, and the ordinate represents the energy difference $\Delta E_{43}$ (meV) between the first light emission upper level and the second light emission upper level.

Figure 8:
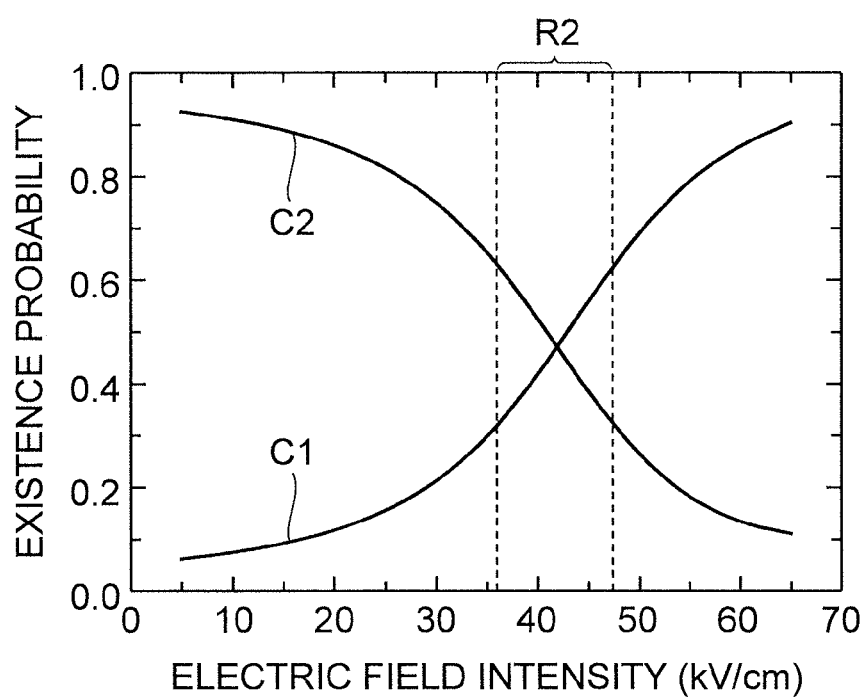
FIG. 8 is a graph illustrating the electric field intensity dependency of the existence probability of an electron at the first light emission upper level or at the second light emission upper level in the light emitting layer except for a first well layer therein.

FIG. 8 is a graph illustrating the electric field intensity dependency of the existence probability of an electron at the first light emission upper level $L_{up1}$ and at the second light emission upper level $L_{up2}$ in the light emitting layer 17 except for the first well layer 161 therein. In this graph, the abscissa represents the electric field intensity (kV/cm) and the ordinate represents the existence probability of an electron at the light emission upper level except for the first well layer 161. Graph C1 represents the existence probability of the first light emission upper level except for the first well layer 161, and Graph C2 represents the existence probability of the second light emission upper level except for the first well layer 161.

In the ranges specified by Ranges R1 and R2 in FIGS. 7 and 8, which are the ranges of electric field intensity of 36 to 47 kV/cm, the first light emission upper level $L_{up1}$ and the second light emission upper level $L_{up2}$ are strongly coupled and the existence probability of an electron except for the first well layer 161 is more than 30% for the first light emission upper level $L_{up1}$ and the second light emission upper level $L_{up2}$, a preferable condition fulfilled. In this condition, the energy difference between the two light emission upper levels reaches its minimum. In the novel QCL described above, the quantum well structure in the unit layered structure 16 and the resulting subband level structure are preferably designed by considering conditions for such a coupled state of the first light emission upper level and the second light emission upper level, their energy difference, and the spreading of their wave functions (existence probabilities).

Figure 9:
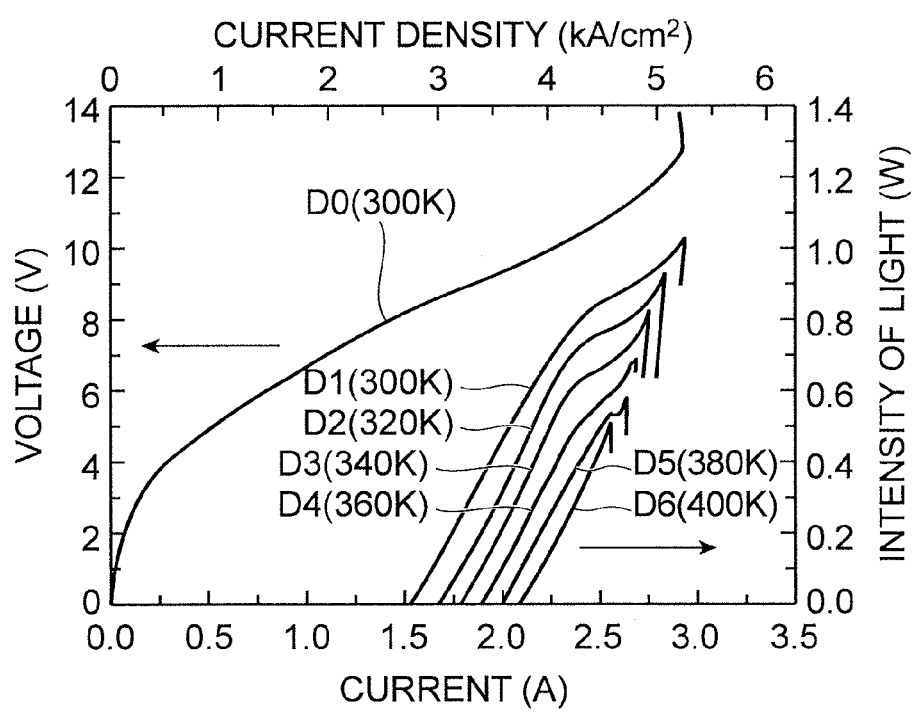
FIG. 9 is a graph illustrating the current-voltage-light output characteristics of the QCL.
Figure 10:
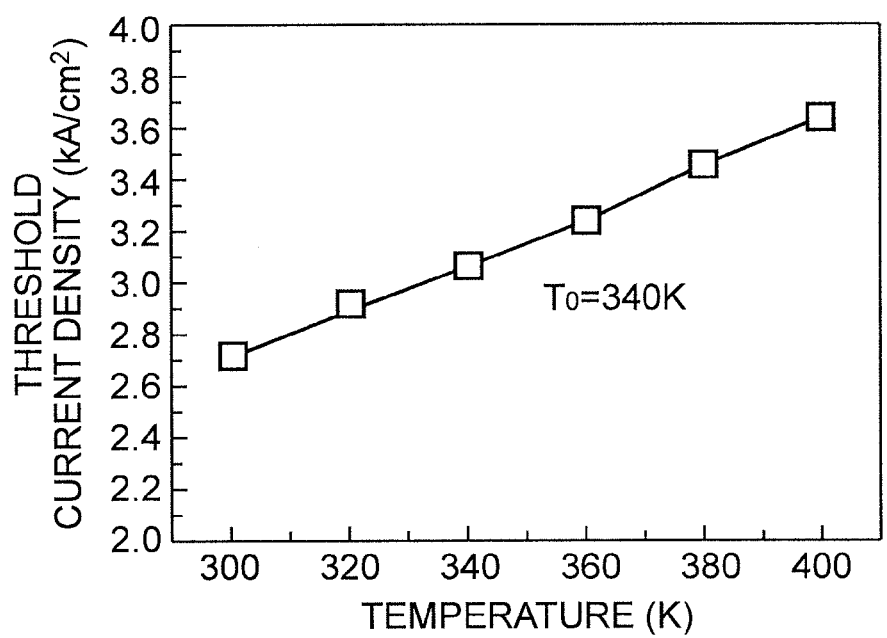
FIG. 10 is a graph illustrating the temperature dependency of threshold current density.
Figure 11:
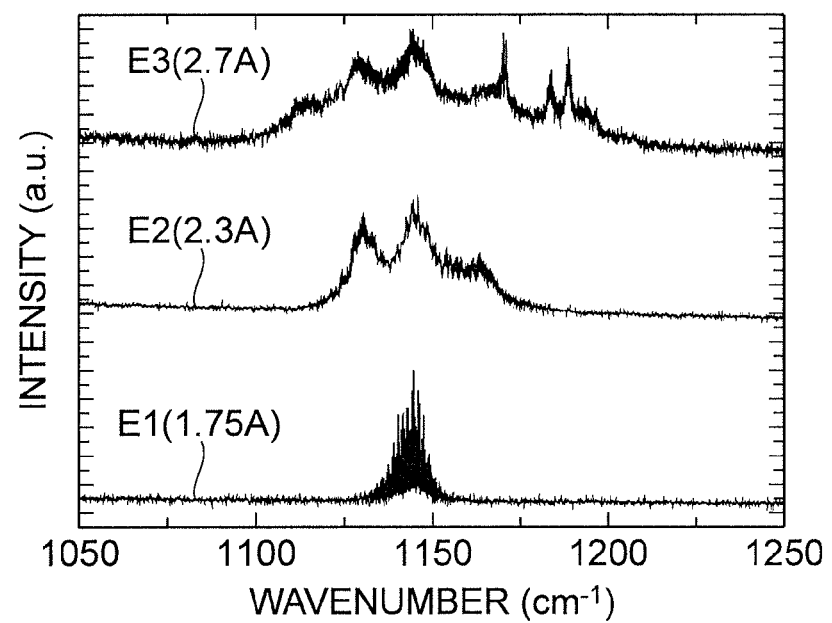
FIG. 11 is a graph of an oscillation spectrum of the QCL.

The following further describes the characteristics and other specifications of the QCL according to the configuration example above with reference to FIGS. 9 to 11. The characteristics are described for the laser device having a configuration in which the resonator has a length of 4 mm and a ridge has a width of 14 μm in the ridge waveguide configuration. A laser end face of the laser device is formed by cleavage and has no coating or the like applied.

FIG. 9 is a graph illustrating the current-voltage-light output characteristics of the QCL. In this graph, the abscissa represents the current (A) or the current density (kA/cm²) and the ordinate represents the voltage (V) or the intensity of light (W). The graph illustrates the characteristics of the laser device pulse-operated with a pulse width of 100 ns and a pulse repetition frequency of 100 kHz. Graph D0 illustrates the current-voltage characteristic at an operational temperature of 300 K, and Graphs D1 to D6 illustrate the current-voltage characteristics at operational temperatures of 300 K, 320 K, 340 K, 360 K, 380 K, and 400 K, respectively.

As illustrated by Graphs D0 to D6, markedly excellent laser characteristics are obtained because of the novel structure described above. The threshold current density is as low as 2.6 kA/cm² at room temperature, which is a value comparable to that of a laser device with a narrow gain width. The total light emission from the both end faces reaches as high as 1 W at room temperature, demonstrating that a markedly high outputting laser device is feasible. The slope efficiency is obtained to be approximately 1 W/A.

FIG. 10 is a graph illustrating the temperature dependency of the threshold current density. In this graph, the abscissa represents the temperature (K) and the ordinate represents the threshold current density (kA/cm²). As illustrated by the graph, the temperature characteristic of the threshold is markedly excellent. The value of the characteristic temperature $T_0$, which indicates the increase rate of the threshold with temperature, is approximately 340 K, which is twice as those of QCLs disclosed so far. The characteristic temperature $T_0$ is defined by the equation below:

$$J_{th}=J_0\exp(T/T_0).$$

In FIG. 10, the maximum operational temperature is beyond 400 K, and it is expected from the threshold and the temperature characteristics that the device is capable of performing oscillation up to 470 K approximately.

FIG. 11 is a graph of an oscillation spectrum of the QCL. In the graph, the abscissa represents the wavenumber (cm⁻¹) and the ordinate represents the intensity (a.u.). Graphs E1 to E3 represents the oscillation spectra at a current of 1.75 A, 2.3 A, and 2.7 A, respectively.

As illustrated by Graphs E1 to E3, the QCL having the novel structure oscillates around a gain peak just after started oscillating, but as the current increases a spreading of the spectrum thought to originate in the instability of coherence is confirmed and the axial mode oscillation is observed over a markedly wide range of wavelengths. From the generation of the axial mode in such a wide range, the gain of the novel structure described above is confirmed to be markedly wide.

Figure 12:
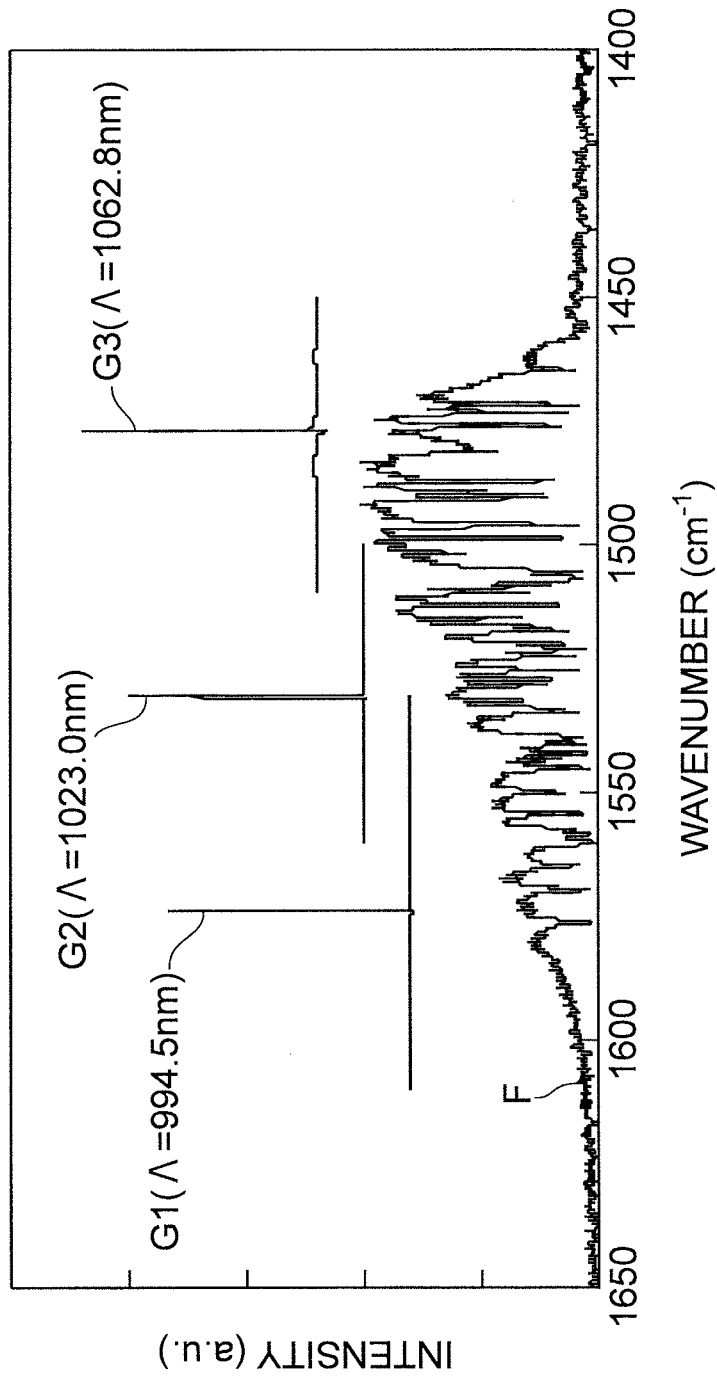
FIG. 12 is a graph of the oscillation spectrum of the QCL and single mode oscillation corresponding to the periodicity of each diffraction grating.

FIG. 12 is a graph of the oscillation spectrum of the QCL and the single mode oscillation according to the periodicity of each diffraction grating. In the graph, the abscissa represents the wavenumber (cm⁻¹) and the ordinate represents the intensity (a.u.).

Graph F represents the oscillation spectrum at a current of 1.4 A. Three kinds of diffraction gratings were fabricated, corresponding to the short-wavelength side, the middle, and the long-wavelength side of the oscillation spectrum. The period Λ of the diffraction grating is set to 994.5 nm, 1023.0 nm, and 1062.8 nm, respectively from the short-wavelength side. As a result, the single mode oscillation was obtained at 1573 cm⁻¹ (6.36 μm) for the diffraction grating having the period Λ of 994.5 nm (refer to G1 in FIG. 12), at 1531 cm⁻¹ (6.53 μm) for the diffraction grating having the period Λ of 1023.0 nm (refer to G2 in FIG. 12), and at 1476 cm⁻¹ (6.77 μm) for the diffraction grating having the period Λ of 1062.8 nm (refer to G3 in FIG. 12).

As described above, it was confirmed that the single mode oscillation is obtained in a wide range of wavelength over 100 cm⁻¹ approximately with the same wafer in the QCL 1 according to the present embodiment. This suggests that for a determined period of the diffraction grating, the gain of the QCL may shift to the short wavelength side or the long wavelength side, but the single mode oscillation is still obtained stably at a single wavelength. By selecting the period of the diffraction grating, the QCLs that perform a plurality of kinds of single mode oscillation can be fabricated from a single wafer.

Method of Manufacturing a Mother Stamper and a Resin Stamper

The following describes a method of manufacturing a mother stamper and a resin stamper with reference to FIGS. 13 and 14.

First, as illustrated in a part (a) of FIG. 13, a SiN film 101 and an electron beam (EB) resist film 102 are sequentially formed on a substrate 100 made of InP. The thickness of the SiN film 101 may be set to 100 nm approximately, and the thickness of the EB resist film 102 may be set to 200 nm approximately. Next, as illustrated in a part (b) of FIG. 13, an electron beam lithography device including an electron beam source exposes the EB resist film 102 to perform patterning.

Subsequently, as illustrated in a part (c) of FIG. 13, patterning of the SiN film 101 is performed by dry etching with the patterned EB resist film 102 serving as a mask. After the etching of the SiN film 101 is performed up to the interface between the SiN film 101 and the substrate 100, the EB resist film 102 is removed. Subsequently, as illustrated in a part (d) of FIG. 13, patterning of the substrate 100 is performed by dry etching with the SiN film 101 serving as a mask.

After that, the SiN film 101 is removed, whereby a mother stamper 103 having a first groove pattern P1 is formed as illustrated in a part (a) of FIG. 14. The asperity shape of the first groove pattern P1 is substantially identical to the asperity shape of a third groove pattern P3 and the asperity shape of the phase shifting diffraction grating to be made. The protrusion positioned in the vicinity of the center in the width direction of the first groove pattern P1 has the width set about twice as those of the other protrusions.

Figure 15:
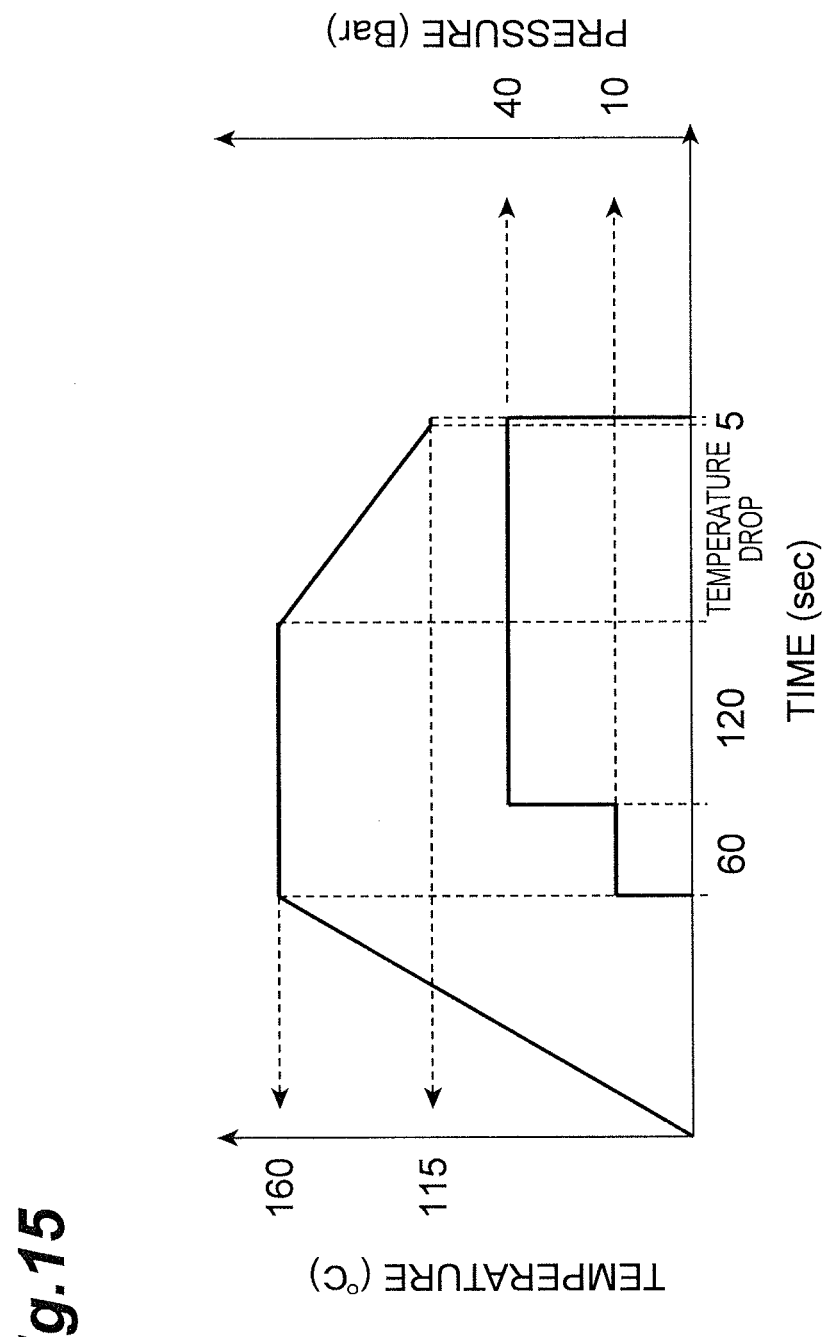
FIG. 15 is a graph of temperature and pressure against time in making the resin stamper.

Subsequently, as illustrated in a part (b) of FIG. 14, the mother stamper 103 is pressed against a resin film 200 having flexibility and ultraviolet transparency. As illustrated in FIG. 15, the mother stamper 103 is first pressed against the resin film 200 by air pressure at a pressure of 10 Bar for 60 seconds while the temperature is kept at 160 degrees centigrade. Next, the mother stamper 103 is then pressed against the resin film 200 by air pressure at a pressure of 40 Bar for 120 seconds while the temperature is kept at 160 degrees centigrade.

After that, the pressure is kept at 40 Bar while the temperature is gradually lowered to 115 degrees centigrade, and the pressure is released 5 seconds after the temperature reached at 115 degrees centigrade. The resin film 200 cures through this heat treatment, and after a demolding treatment the first groove pattern P1 of the mother stamper 103 is transferred to the resin film 200. Consequently, as illustrated in a part (c) of FIG. 14, a rein stamper 201 is formed that has a second groove pattern having the inverted asperity of the first groove pattern P1 and has flexibility and ultraviolet transparency.

Examples of the resin film 200 used in the present embodiment include the Intermediate Polymer Stamp (IPS) (International Trademark Registration No. 935981) manufactured by Obducat AB (publ). When a resist film 304 to be described later is subjected to heat treatment, the resist film 304 contracts and cures, and thus it is preferable to design the asperity shape of the mother stamper 103 with this influence taken into account.

Method of Manufacturing the Phase Shift Diffraction Grating

The following describes a method of manufacturing the phase shift diffraction grating with reference to FIGS. 16 and 17.

First, as illustrated in a part (a) of FIG. 16, an intermediate structure (wafer) 300 on which the cladding layer 13a, the lower core layer 11, the active layer 15, and the upper core layer 12 are disposed in this order from the semiconductor substrate 10 side is formed on the semiconductor substrate 10. Then, an InP film (wafer) 301, an InGaAs film (wafer) 302, a SiN film (intermediate film) 303, and the resist film 304 formed of ultraviolet (UV) curable resin are sequentially stacked on a surface of the intermediate structure 300 in this order to form a layered structure 305. The thickness of the InP film 301 may be set to 200 nm to 300 nm, the thickness of the InGaAs film 302 may be set to 100 nm, the thickness of the SiN film 303 may be set to 100 nm to 200 nm, and the thickness of the resist film 304 may be set to 150 nm to 250 nm. Examples of the resin film 304 used in the present embodiment include the STU (International Trademark Registration No. 936730) resist TU2-120 manufactured by Obducat AB (publ).

Figure 18:
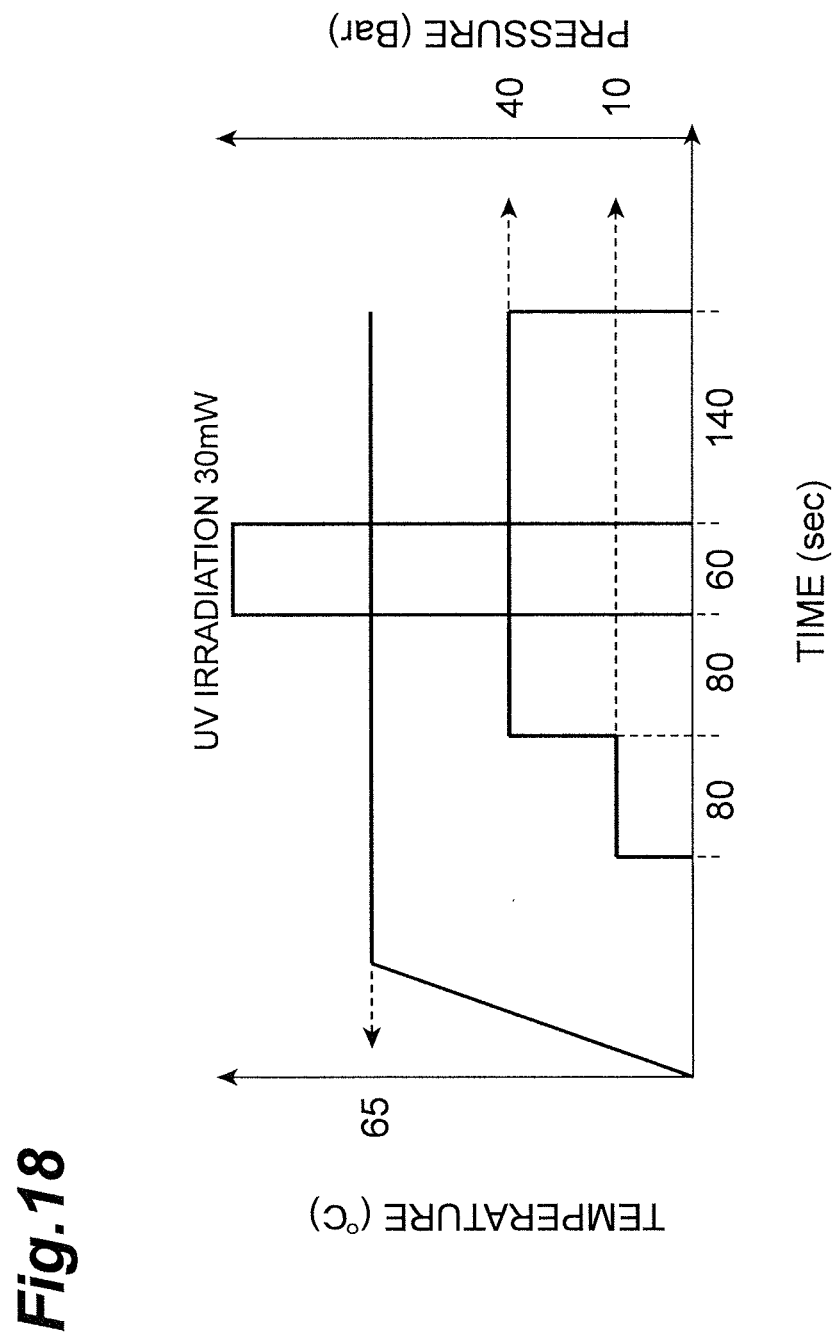
FIG. 18 is a graph of temperature and pressure against time in making the phase shift diffraction grating.

Subsequently, after the asperity surface of the resin stamper 201 and the resist film 304 are oppositely arranged as illustrated in the drawing, the resin stamper 201 is pressed against the resist film 304 as illustrated in a part (b) of FIG. 16. As illustrated in FIG. 18, the resin stamper 201 is first pressed against the resin film 304 by air pressure at a pressure of 10 Bar for 80 seconds while the temperature is kept at 65 degrees centigrade.

The resin stamper 201 is then pressed against the resin film 304 by air pressure at a pressure of 40 Bar for 280 seconds while the temperature is kept at 65 degrees centigrade. Then, 80 seconds after pressed at a pressure of 40 Bar, the resist film 304 is subjected to UV irradiation of 30 mW for 60 seconds through the resin stamper 201 having ultraviolet transparency. The resist film 304 cures through this heat treatment and UV irradiation treatment. In this process, because the resin stamper 201 and the resist film 304 are both resin and thermal curing treatment cannot be performed at high temperatures unlike the case of making the resin stamper 200.

Subsequently, as illustrated in a part (c) of FIG. 16, the resin stamper 201 is removed from the resist film 304. Then, the film remaining at the concave portions of the resist film 304 is removed, whereby the second groove pattern P2 of the resin stamper 201 is transferred to the resist film 304. Consequently, as illustrated in a part (d) of FIG. 16, the third groove pattern P3 having the inverted asperity of the second groove pattern P2 is formed on the resist film 304.

Subsequently, as illustrated in a part (a) of FIG. 17, patterning of the SiN film 303 is performed by dry process (reactive ion etching, RIE) with the patterned resist film 304 serving as a mask. After that, as illustrated in a part (b) of FIG. 17, the resist film 304 is removed by dry process (ashing). Subsequently, as illustrated in a part (c) of FIG. 17, patterning of the InGaAs film 302 is performed by wet process with the SiN film 303 serving as a mask. The wet process is selected in this process because the surface of the InGaAs film 302 subjected to patterning by dry process is slightly rough, so that the cladding layer 13b to be stacked subsequently will be unlikely to exactly fit to the groove pattern of the InGaAs film 302, which can affect device characteristics.

Etching of the InGaAs film 302 is performed up to the interface between the InGaAs film 302 and the InP film 301 because the InP film 301 functions as the stopper for the etching. After that, the SiN film 303 is removed, whereby the same groove pattern as the third groove pattern P3 is formed on the InGaAs film 302 as illustrated in a part (d) of FIG. 17. As a result, the InP film 301 serves as the base 20a and the patterned InGaAs film 302 serves as the protrusions 20b, whereby the diffraction grating 20 is made. The method described above of manufacturing the phase shifting diffraction grating is what is called the "nanoimprint lithography".

After that, the cladding layer 13b is stacked on the diffraction grating layer 20 to fill the gaps between the protrusions 20b, and the contact layer 14 is stacked on the cladding layer 13b. The QCL 1 is thus manufactured.

Advantages and Effects

The following describes advantages and effects of the present embodiment.

In the QCL 1 illustrated in FIGS. 1 and 2, the unit layered structure 16 consisting of the light emitting layer 17 and the injection layer 18 includes two light emission upper levels of the first light emission upper level $L_{up1}$ and the second light emission upper level $L_{up2}$ and the (two or more) light emission lower levels $L_{low}$, as levels involved in light emission. As described above, with a combination of two light emission upper levels and two or more (preferably, three or more) light emission lower levels, light emission over a wide range of wavelengths can be achieved appropriately.

In the above configuration, one of the first light emission upper level $L_{up1}$ and the second light emission upper level $L_{up2}$ is the ground level (a level attributable to the ground level) of the first well layer of the light emitting layer 17, and the other is an excited level (a level attributable to the excited level) of the well layers in the light emitting layer except for the first well layer (the second to the n-th well layers). The energy difference $\Delta E_{43}$ between the first light emission upper level and the second light emission upper level is set to be smaller than the LO phonon energy and the energy difference $\Delta E_{54}$ between the second light emission upper level and the high energy level is set to be larger than the LO phonon energy.

With such a configuration, characteristics such as the emission spectrum and other specifications obtained through light emitting transition can be appropriately set and controlled through designing of the coupling strength and energy difference between the levels, unlike an active layer structure utilizing a super lattice structure with a miniband consisting of excited levels of the well layers as the light emission upper levels.

In particular when the two light emission upper levels $L_{up1}$ and $L_{up2}$ are designed to be strongly coupled in the presence of the operational electric field, these two upper levels behave as if they are a single light emission upper level having a range in energies. In this case, the obtained emission spectrum is not an uneven spectrum as with the super lattice structure but an evenly distributed spectrum. Such an emission spectrum is suitable for broad spectrum single axial mode light sources such as EC type and DFB type. The conventional semiconductor laser is known to cause gain spectral hole burning at laser oscillation, but the QCL according to the present embodiment causes no hole burning and is thus capable of retaining a single axial mode oscillation.

In the subband level structure illustrated in FIG. 2, an electron having undergone a light emitting transition between subbands in the quantum well light emitting layer 17 is swiftly extracted from the light emission lower level $L_{low}$ through the relaxation level $L_r$ in the injection layer 18. This allows an efficient generation of the population inversion in the light emitting layer 17. With the configurations described above, the QCL capable of achieving light emission in a wide range of wavelengths appropriately is fabricated.

The subband level structure of the unit layered structure 16 described above can be controlled by designing of the quantum well structure of the unit layered structure 16 included in the active layer 15. The subband level structure illustrated in FIG. 2 includes the miniband MB that has a function as the lower miniband including the light emission lower levels $L_{low}$ and a function as the relaxation miniband including the relaxation levels $L_r$, and extends from the light emitting layer 17 to the injection layer 18. Such a configuration allows an appropriate formation of a light emitting transition structure of two upper levels and a plurality of lower levels, and a relaxation structure for an electron having undergone a light emitting transition. By utilizing the band structure in which the miniband in the light emitting layer 17 and the miniband in the injection layer 18 are strongly coupled, a high efficient electron transport is achieved from the light emitting layer 17 to the injection layer 18.

In the subband level structure of the QCL 1 described above, the energy difference $\Delta E_{43}$ between the first light emission upper level $L_{up1}$ and the second light emission upper level $L_{up2}$ is preferably set within a range satisfying the condition of 10 meV or more and 25 meV or less:

$$\sim 10 \text{ meV} \le \Delta E_{43} \le 25 \text{ meV}.$$

This allows an appropriate setting of laser device characteristics such as the emission spectrum due to light emitting transitions from the first light emission upper level and the second light emission upper level to the light emission lower levels.

The following describes the setting of the energy difference between the first light emission upper level and the second light emission upper level in detail. These two upper levels are broadened over a certain width because of influences from scattering and temperature. The extent of this level broadening is typically around ±~10 meV, although determined by temperature and the interfaces and impurities within a crystal. This can be observed as the FWHM of absorption or emission. By appropriately setting the energy difference $\Delta E_{43}$ with this broadening width of the upper levels taken into account, these two levels can be regarded as a pseudo single light emission upper level.

For carrier distributions at the two upper levels, carriers need to be distributed evenly enough between the two upper levels functioning as a pseudo single light emission upper level. When the number of carriers at the first light emission upper level (level 3) energetically lower is denoted by $N_3$ and the number of carriers at the second light emission upper level (level 4) energetically higher is denoted by $N_4$, the ratio between the numbers of carriers is given by the following equation:

$$N_4/N_3 = \exp(-\Delta E_{43}/kT).$$

At a room temperature (kT=25 meV), for example, when the energy difference $\Delta E_{43}$ between the first light emission upper level and the second light emission upper level is set to ~20 meV, the ratio $N_4/N_3$ is ~0.45, which means that the second light emission upper level $L_{up2}$ has approximately half the carriers at the first light emission upper level $L_{up1}$. When it is configured that an electron from the injection layer 18a of the previous period is injected into the second light emission upper level $L_{up2}$, the numbers of carriers $N_3$ and $N_4$ can be made approximately equal.

Every energy difference $\Delta E_2$ between the adjacent levels of the light emission lower levels $L_{low}$ (lower miniband) (refer to FIG. 2) is preferably set to be smaller than the LO phonon energy ($\Delta E_2 < E_{LO}$). This configuration also allows an appropriate setting of laser device characteristics such as the light emission spectrum due to light emitting transitions from the first light emission upper level and the second light emission upper level to the light emission lower levels.

The energy difference $\Delta E_2$ within the light emission lower levels $L_{low}$), is preferably set within a range further satisfying the condition of 10 meV or more and 25 meV or less:

$$10 \text{ meV} \le \Delta E_2 \le 25 \text{ meV},$$

as with the first light emission upper level and the second light emission upper level. The number of the light mission lower levels $L_{low}$ is preferably three or more.

The energy difference $\Delta E_{54}$ between the second light emission upper level $L_{up2}$ and the high energy level $L_h$ is preferably set within a range further satisfying the condition of 50 meV or more:

$$50 \text{ meV} \le \Delta E_{54}.$$

This can prevent an electron that is to be injected from the level $L_r$ in the injection layer 18a of the previous period into the first light emission upper level $L_{up1}$ and the second light emission upper level $L_{up2}$ from leaking into a level higher than the light emission upper levels. Such a level structure in which the higher energy levels are separated enough from the first light emission upper level and the second light emission upper level is definitely different from the upper miniband utilizing the super lattice structure in an active layer.

An electron e⁻ from the level $L_r$ in the injection layer 18a of the previous period into the quantum well light emitting layer 17 is preferably injected into the second light emission upper level $L_{up2}$. As described above, by injecting an electron into the second light emission upper level, which is the higher level between the first light emission upper level and the second light emission upper level, carriers are distributed evenly between the two upper levels, thereby appropriately achieving light emitting transitions from the first light emission upper level and the second light emission upper level to the lower levels.

The probabilities of an electron at the first light emission upper level $L_{up1}$ and the second light emission upper level $L_{up2}$ existing in the active layer except for the first well layer of the quantum well light emitting layer 17 are preferably 30% or more, the probabilities given by its squared wave functions. With a configuration in which the wave functions of the first light emission upper level and the second light emission upper level are not localized in the first well layer to allow an electron to exist with a sufficient probability in the second to the n-th well layers with these wave functions extending over the entire light emitting layer 17, the first light emission upper level and the second light emission upper level each appropriately function as a level for light emitting transitions to the light emission lower levels, thereby achieving evenly light emitting transitions.

A wafer for a QCL is a layered structure of a compound semiconductor. Its mechanical strength is thus relatively low and its surface flatness is also relatively low (the maximum of about 10 μm roughness in the wafer surface). In the manufacturing method of the QCL 1 according to the present embodiment, the resin stamper 201 made of the resin film 200 having flexibility is pressed against the resist film 304 by air pressure to transfer the second groove pattern P2 to the resist film 304. The wafer with low flatness is thus evenly pressured by the air pressure, whereby the second groove pattern P2 of the resin stamper 201 is transferred to the resist film 304 markedly precisely. A high-precision diffraction grating is thus obtained, which allows manufacturing of the QCL capable of stably performing single mode oscillation.

In the manufacturing method of the QCL 1 according to the present embodiment, the mother stamper 103 with the first groove pattern P1 formed is pressed against the resin film 200 to transfer the first groove pattern P1 to the resin film 200, thereby making the resin stamper 201 with the second groove pattern P2 formed on the resin film 200, the second groove pattern P2 having the inverted asperity of the first groove pattern P1. With the mother stamper 103 made once, any number of the same resin stampers 201 can be duplicated in a case of the resin stamper 201 being damaged. The resin stamper 201 can be used any number of times as long as it is not damaged.

In the manufacturing method of the QCL 1 according to the present embodiment, the resin stamper 201 is made of the resin film 200 having flexibility, and a plurality of diffraction gratings can be made at once on the wafer for the resin stamper 201 with a large area. This can improve the mass production capacity of the QCL 1. A plurality of diffraction gratings with different periods can be made at once on the wafer according to the second groove pattern P2 of the resin stamper 201. The QCL 1 capable of performing a plurality of kinds of single mode oscillation can be made from one wafer.

In the manufacturing method of the QCL 1 according to the present embodiment, the diffraction grating formed on the surface of the wafer is a phase shifting diffraction grating. The bimodal oscillation stemming from an error in the position of cleavage of the diffraction grating in manufacturing is thus prevented, which allows manufacturing of the QCL 1 that stably performs the single mode oscillation. A λ/4 phase shifting diffraction grating with the asperity phase of the diffraction grating inverted in the vicinity of the center of the diffraction grating is preferably adopted in the present embodiment in particular, and thus the oscillation threshold gain can be only for one mode, the minimum mode.

In the manufacturing method of the QCL 1 according to the present embodiment, the SiN film 303 and the resist film 304 are sequentially stacked on the wafer (InGaAs film 302). The adhesion between the wafer (InGaAs film 302) and the resist film 304 is thus given by the SiN film 303, and a rip-off (a phenomenon in which part of the third pattern P3 is flaked off when the resin stamper 201 is released from the resist film 304 because of the adhesion between the resin stamper 201 and part of the resist film 304) can be reduced.

In the manufacturing method of the QCL 1 according to the present embodiment, the InP film 301 is formed on a surface on the active layer 15 side of the intermediate structure 300. The InGaAs film 302 is then formed on a surface of the InP film 301. The distance from the active layer 15 to the InGaAs film 302 can thus be adjusted through the thickness of the InP film 301. The InGaAs film 302 is etched to function as a diffraction grating, and thus the coupling factor of the diffraction grating can be adjusted for a wavelength by adjusting the thickness of the InP film 301 as the base 20a. The InP film 301 functions as a stopper during etching of the InGaAs film 302, thereby allowing a markedly precise control of the groove depth of the diffraction grating.

In the manufacturing method of the QCL 1 according to the present embodiment, the resist film 304 is formed of ultraviolet curable resin, and the resin stamper 201 has ultraviolet transparency. While the resin stamper 201 is press-bonded to the resist film 304, ultraviolet light can thus be applied through the resin stamper 201 to the resist film 304.

Other Embodiments

The QCL according to the present invention is not limited to the embodiment and the configuration example described above but allows various modifications. The configuration example above describes an example with the semiconductor substrate using the InP substrate and the active layer made of InGaAs/InAlAs, but various configurations can be adopted as long as they allow light emitting transition through intersubband transition in a quantum well structure and realization of the subband level structure described above.

As such a semiconductor material, various materials other than InGaAs/InAlAs described above can be used such as GaAs/AlGaAs, InAs/AlSb, GaN/AlGaN, and SiGe/Si. Various methods may be used as a semiconductor crystal growth method.

Various structures other than those illustrated in FIGS. 1, 3, and 4, may be adopted as the layered structure in the active layer of the QCL and the semiconductor layered structure as the entire laser device. The QCL typically needs to include the semiconductor substrate and the active layer disposed on the semiconductor substrate and having the configuration described above. The above configuration example describes the configuration lattice-matched to the InP substrate, but a configuration lattice-mismatched to the InP substrate may be adopted. This configuration can increase flexibility in device design, and achieve effective carrier confinement and shortened oscillation wavelength.

In the present embodiment, the diffraction grating layer 20 is formed as a $\lambda/4$ phase shifting diffraction grating, but may be a diffraction grating with a phase shifting amount other than $\lambda/4$. The $\lambda/4$ phase shifting diffraction grating, however, is preferably adopted as in the present embodiment because the oscillation threshold gain is then only for one mode, the minimum mode.

In the present embodiment, the diffraction grating layer 20 includes the base 20a, but the protrusions 20b may be directly disposed on the active layer 15 (the upper core layer 12) without the base 20a. That is, the InGaAs layer 302, the SiN film 303, and the resist film 304 are sequentially stacked on a surface of the intermediate structure 300 to form the diffraction grating.

In the present embodiment, the SiN film 303 is formed as an intermediate layer between the wafer and the resist film 304, but a SiO$_2$ film may be formed in place of the SiN film 303 or such an intermediate layer may need not to be provided.

In the present embodiment, the InP substrate 100 is used as the mother stamper 103, but other materials or other processing methods may be selected as long as precise processing is possible.

REFERENCE SIGNS LIST

1 . . . QCL, 10 . . . semiconductor substrate, 11 . . . lower core layer, 12 . . . upper core layer, 13 . . . cladding layer, 14 . . . contact layer, 15 . . . active layer, 16 . . . unit layered structure, 17 . . . quantum well light emitting layer, 18 . . . injection layer, 20 . . . diffraction grating, 303 . . . SiN film (intermediate film), P1 . . . first groove pattern, P2 . . . second groove pattern, P3 . . . third groove pattern.

The invention claimed is:

1. A quantum cascade laser manufacturing method comprising:
a first step of preparing a mother stamper with a predetermined first groove pattern formed on a surface of a substrate;
a second step of pressing the mother stamper against a heated resin film having flexibility and maintaining pressure of the mother stamper while the resin film cures to transfer the first groove pattern to the resin film and making a resin stamper with a second groove pattern formed on the resin film, the second groove pattern having an inverted asperity of the first groove pattern;
a third step of making a wafer, which includes a semiconductor substrate and an active layer formed on the substrate, the active layer having a cascade structure, the cascade structure including a plurality of quantum well light emitting layers and a plurality of injection layers, the plurality of quantum well light emitting layers and the plurality of injection layers being stacked alternately;
a fourth step of forming an intermediate film on a surface on the active layer side of the wafer;
a fifth step of forming a resist film on a surface of the intermediate film;
a sixth step of pressing the resin stamper against the resist film by air pressure to transfer the second groove pattern to the resist film and forming on the resist film a third groove pattern having an inverted asperity of the second groove pattern, wherein the sixth step comprises:
pressing the resin stamper down onto the resist film at a first air pressure while heating the resist film at a temperature lower than that of the second step,
then pressing the resin stamper down onto the resist film at a second air pressure higher than the first air pressure while continuing to heat the resist film at the temperature lower than that of the second step, and
then, after a predetermined time has passed since applying the second air pressure, irradiating the resist film with ultraviolet light;
a seventh step of etching the intermediate film with the resist film serving as a mask;
an eighth step of etching the wafer with the etched intermediate film in the seventh step serving as a mask to form a phase shifting diffraction grating on a surface of the wafer; and
a ninth step of removing the etched intermediate film after the eighth step,
wherein the intermediate film is a SiN film or a SiO$_2$ film.

2. The method according to claim 1, further comprising:
a tenth step of forming an InP film on a surface on the active layer side of the wafer, after the third step and before the fourth step; and
an eleventh step of forming an InGaAs film on a surface of the InP film, after the tenth step and before the fourth step.

3. The method according to claim 1, wherein the resist film is formed of ultraviolet curable resin and the resin stamper has ultraviolet transparency.

4. The method according to claim 2, wherein the resist film is formed of ultraviolet curable resin and the resin stamper has ultraviolet transparency.

* * * * *